(12) United States Patent
Valli et al.

(10) Patent No.: US 9,806,687 B2
(45) Date of Patent: Oct. 31, 2017

(54) SYSTEM AND METHOD FOR SIGNAL AMPLIFICATION USING A RESISTANCE NETWORK

(71) Applicant: Infineon Technologies AG, Neubiberg (DE)

(72) Inventors: Luca Valli, Villach (IT); Benno Muehlbacher, St. Magdalen (AT); Richard Gaggl, Poertschach am (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/078,199

(22) Filed: Mar. 23, 2016

(65) Prior Publication Data
US 2017/0279425 A1    Sep. 28, 2017

(51) Int. Cl.
    *H03F 3/45*    (2006.01)
    *H03G 1/00*    (2006.01)

(52) U.S. Cl.
    CPC ....... *H03G 1/0088* (2013.01); *H03F 3/45179* (2013.01); *H03F 2203/45222* (2013.01)

(58) Field of Classification Search
    CPC ........................................................ H03F 3/45
    USPC ................................................. 330/254, 261
    See application file for complete search history.

(56) References Cited

U.S. PATENT DOCUMENTS

| 4,146,844 A * | 3/1979 | Quinn | H03F 1/32 330/149 |
|---|---|---|---|
| 4,610,001 A * | 9/1986 | Ong | G11C 7/00 330/252 |
| 7,088,179 B2 * | 8/2006 | Gilbert | H03F 1/26 330/254 |
| 7,990,217 B2 * | 8/2011 | Gilbert | H03F 1/26 330/254 |
| 2012/0039487 A1 * | 2/2012 | Sakai | H03F 1/52 381/104 |
| 2013/0049525 A1 * | 2/2013 | Petkov | G01D 5/24 310/300 |

* cited by examiner

*Primary Examiner* — Henry Choe
(74) *Attorney, Agent, or Firm* — Slater Matsil, LLP

(57) ABSTRACT

A signal amplification method includes receiving, from a capacitive sensor, a first input signal by a first control terminal of a first transistor, and a second input signal by a first control terminal of a second transistor. The method also includes producing a first output signal, including amplifying a first signal at a first load path terminal of the first transistor using a first inverting amplifier having an output coupled to a resistance network, and producing a second output signal, including amplifying a second signal at a first load path terminal of the second transistor using a second inverting amplifier having an output coupled to the resistance network. The method also includes feeding back the first and second output signal to a second load path terminal of the first transistor and to a second load path terminal of the second transistor via the resistance network according to a pre-determined fraction.

32 Claims, 13 Drawing Sheets

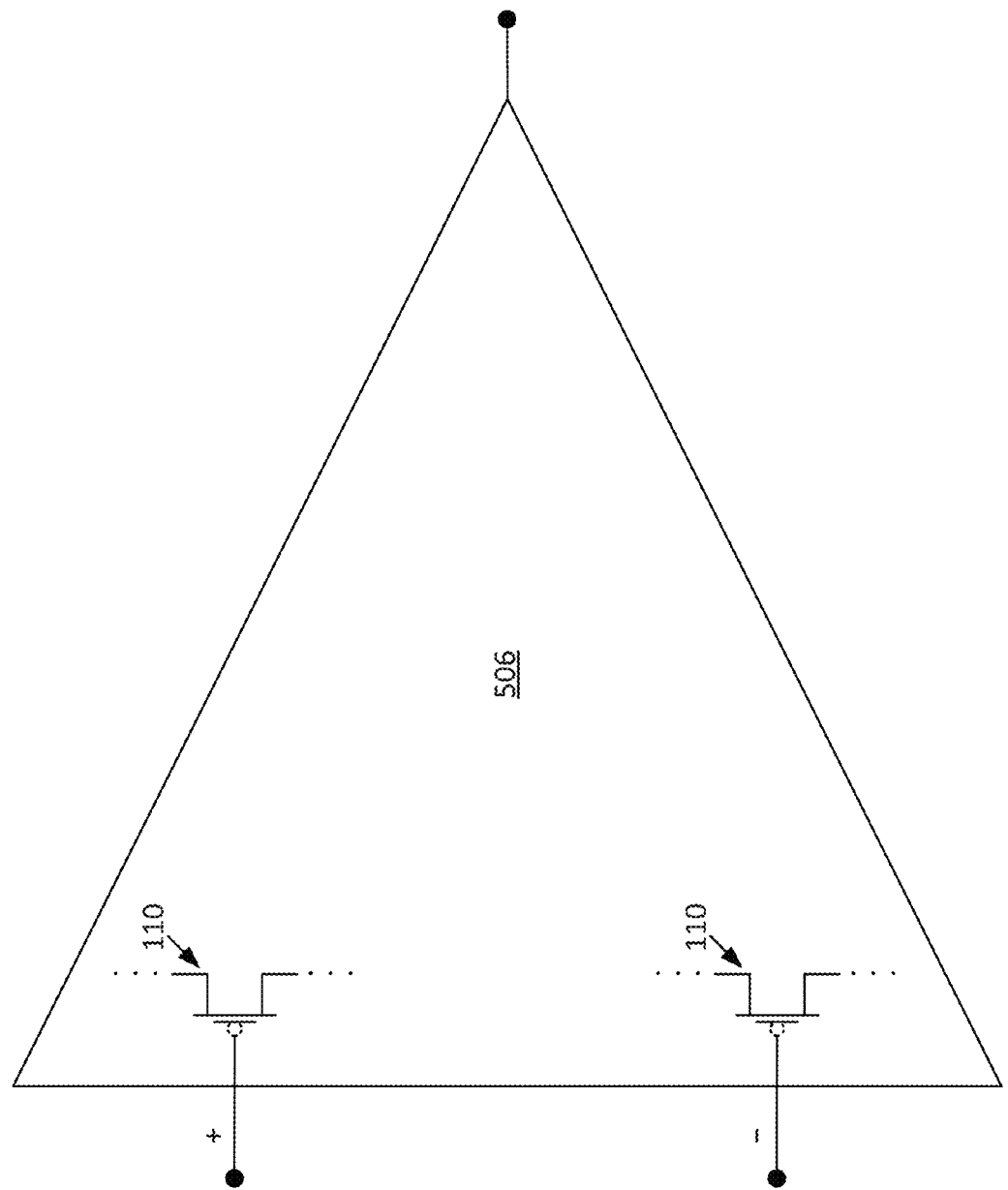

SYSTEM AND METHOD FOR SIGNAL AMPLIFICATION USING A RESISTANCE NETWORK

TECHNICAL FIELD

The present invention relates generally to a system and method for signal amplification, and, in particular embodiments, to a system and method for signal amplification using a resistance network.

BACKGROUND

Small-scale sensors are used in a wide variety of applications, a few examples of which include microphone systems, blood pressure monitoring systems, and accelerometer systems for, e.g., airbag deployment. To allow the use of sensors to become even more widespread, the size of end products that read out signals from these sensors is continually decreasing.

Additionally, to support the reduced size of these end products, sensors may be implemented using Micro-Electro-Mechanical Systems (MEMS). For example, mobile phone products, which are becoming more and more compact, especially in thickness, may use MEMS microphone implementations.

Moreover, to further reduce end product size the MEMS sensors themselves continue to shrink. As the package size of MEMS sensors decreases, however, the sensitivity of these sensors may also decrease.

SUMMARY

In accordance with a first example embodiment of the present invention, an amplification device is provided. The amplification device includes a resistance network coupled between a first output of the amplification device and a second output of the amplification device. The amplification device also includes a first transistor having a control terminal coupled to a first input node of the amplification device. The amplification device also includes a first load path terminal coupled to the resistance network at a first node. The amplification device also includes a second transistor having a control terminal coupled to a second input node of the amplification device and a first load path terminal coupled to the resistance network at a second node. The amplification device also includes a capacitive sensor coupled to the first input node and to the second input node. The amplification device also includes a first inverting amplifier that includes an input coupled to a second load path terminal of the first transistor and an output coupled to a first output node of the amplification device. The amplification device also includes a second inverting amplifier that includes an input coupled to a second load path terminal of the second transistor. The second inverting amplifier also includes an output coupled to a second output node of the amplification device.

In accordance with a second example embodiment of the present invention, a method for signal amplification is provided. The method includes receiving, by a first control terminal of a first transistor, a first input signal from a capacitive sensor. The method also includes receiving, by a first control terminal of a second transistor, a second input signal from the capacitive sensor. The method also includes producing a first output signal, to include amplifying a first signal at a first load path terminal of the first transistor using a first inverting amplifier having an output coupled to a resistance network. The method also includes producing a second output signal, to include amplifying a second signal at a first load path terminal of the second transistor using a second inverting amplifier having an output coupled to the resistance network. The method also includes feeding back the first output signal and the second output signal to a second load path terminal of the first transistor and to a second load path terminal of the second transistor via the resistance network according to a pre-determined fraction.

In accordance with a third example embodiment of the present invention, an amplifier system is provided. The amplifier system includes a first transistor having a control terminal coupled to a first input node, a second transistor having a control terminal coupled to a second input node. In this implementation, the amplifier system also includes a first inverting amplifier. The first inverting amplifier includes a third transistor having a first load path terminal coupled to the first load path terminal of the first transistor. The amplifier system also includes a first output node coupled to an output of the first inverting amplifier. The amplifier system also includes a second inverting amplifier, which includes a fourth transistor having a first load path terminal coupled to the first load path terminal of the second transistor. The amplifier system also includes a second output node coupled to an output of the second inverting amplifier. The amplifier system also includes a switchable resistance network coupled between the output of the first inverting amplifier and the output of the second inverting amplifier. The switchable resistance network is selectably coupled to a second load path terminal of the first transistor and to a second load path terminal of the second transistor.

BRIEF DESCRIPTION OF THE DRAWINGS

For a more complete understanding of the present invention, and the advantages thereof, reference is now made to the following descriptions taken in conjunction with the accompanying drawings, in which:

FIG. 5B is a block diagram that illustrates the differential amplifier stage of FIG. 5A in more detail;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

The present invention will be described with respect to preferred embodiments in a specific context, a system and method for signal amplification for a capacitive microphone sensor. Further embodiments may be used to read out a variety of AC coupled or DC coupled signals types using configurable amplification or attenuation by a stage having high input impedance.

In various embodiments, an amplifier circuit having a differential input is enhanced with a current feedback in order to have a configurable voltage gain. The voltage gain of this differential amplifier may be either a positive-decibel (dB) gain of greater than zero dB, or a negative-dB gain of less than zero dB (i.e., an attenuation).

In various embodiments, the amplifier circuit has a pseudo-differential output provided by a pair of amplifier single-ended circuits, which each include an input transistor and an inverting output stage. The voltage gain of each single-ended circuit is controlled by current feedback provided by a resistive feedback network coupled to both amplifier single-ended circuits. In some embodiments, the voltage gain of the amplifier circuit may be adjusted by selectively coupling the source terminals of the input transistors to various nodes of the resistive feedback network. The gain may be further adjusted by selectively coupling the body terminals of the input transistors to the various nodes of the resistive feedback network, for example, to provide selectable attenuation. In some embodiments, the amplifier circuit may be used to amplify the output of a capacitive sensor having a differential or pseudo-differential output, such as an output of a double-backplate MEMS microphone.

Figure 1:
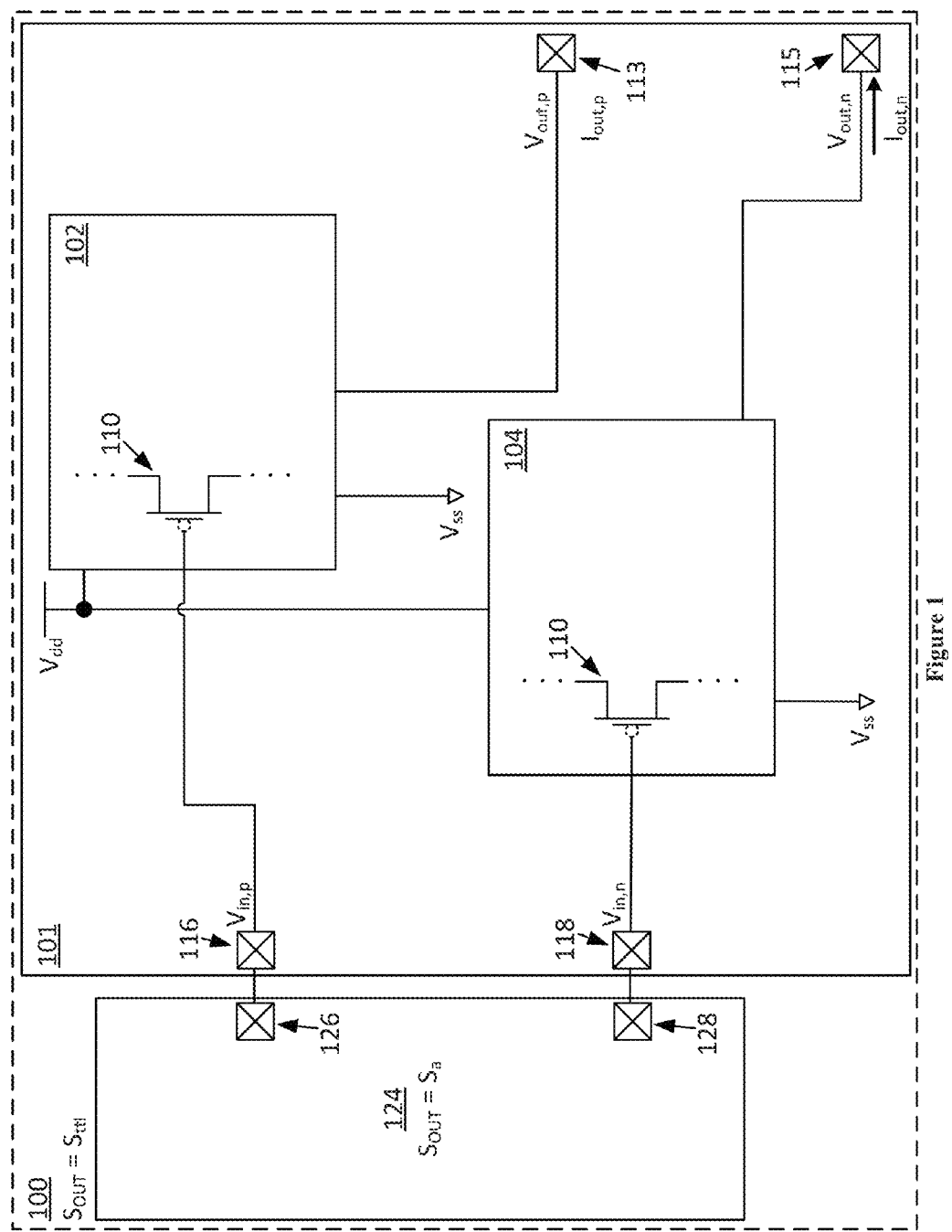
FIG. 1 is a block diagram that illustrates a signal buffering system that uses current feedback to provide a configurable voltage gain for a differential input device, in accordance with one of a number of embodiments.

FIG. 1 illustrates an embodiment signal buffering system 100 that includes a buffer circuit 101, which receives a pair of differential input signals at nodes having high input impedances. Buffer circuit 101 includes high impedance stages 102 and 104 that have high input impedances and that read out the output signal from an input device 124 that is included in the signal buffering system 100. Buffer circuit 101 also includes input terminals 116 and 118. Input terminal 116 is connected to the gate of an input transistor 110 of high impedance stage 102, and provides it a first differential amplifier input signal having a voltage $V_{in,p}$. Input terminal 118 is similarly connected to the gate of an input transistor 110 of high impedance stage 104 and provides it a second differential amplifier input signal having a voltage $V_{in,n}$ that is the negative of $V_{in,p}$. Input transistors 110 may be implemented, for example, as n-channel or p-channel Metal Oxide Semiconductor Field Effect Transistors (MOSFETs). Buffer circuit 101 also includes output terminals 113 and 115 for each of these high impedance stages 102 and 104, respectively. Output terminal 113 provides a first buffered output signal having a voltage $V_{out,p}$ and a current $I_{out,p}$, and output terminal 115 provides a second buffered output signal having a voltage $V_{out,n}$ and a current $I_{out,n}$. Each of high impedance stages 102 and 104 also is connected between a pair of supply voltages, which in the embodiment of FIG. 1 are depicted as rail voltages $V_{dd}$ and $V_{ss}$.

Input terminals 116 and 118 are also connected to differential output terminals 126 and 128 of the input device 124. In an embodiment, the buffer circuit 101 is implemented on an integrated circuit (IC) that may be, for example, an Application Specific IC (ASIC). In such an IC embodiment, input terminals 116 and 118 and output terminals 113 and 115 may be, e.g., contact pads of the IC. Input device 124 is connected between the buffer circuit 101 and a fixed bias voltage $V_{FB}$. In some embodiments, input device 124 is a sensor such as, for example, a microphone. In some embodiments, input device 124 is a MEMS-based sensor. In some embodiments, input device 124 includes one or more capacitive sensors. In other embodiments, buffer circuit 101 is coupled to the signal source of input device 124 via DC coupling.

Referring again to FIG. 1, input device 124 has an output sensitivity $S_{OUT}=S_a$. If high-impedance stages 102 and 104 were each to be implemented using a simple source follower or super source follower stage that does not have a voltage gain, the output voltage noise $V_{n\_out}$ of the buffer circuit 101 could be approximated as varying with the input-referred voltage noise $V_{n\_in}$ of each of high-impedance stages 102 and 104, in accordance with Equation 1:

$$V_{n\_out}^2 \approx 2*(V_{n\_in})^2 \quad \text{(Eq.1)}$$

To achieve, however, a target output sensitivity $S_{trl}$ for the signal buffering system 100 that is greater than $S_a$, high-impedance stages 102 and 104 would need to provide a positive-dB voltage gain.

Figure 2:
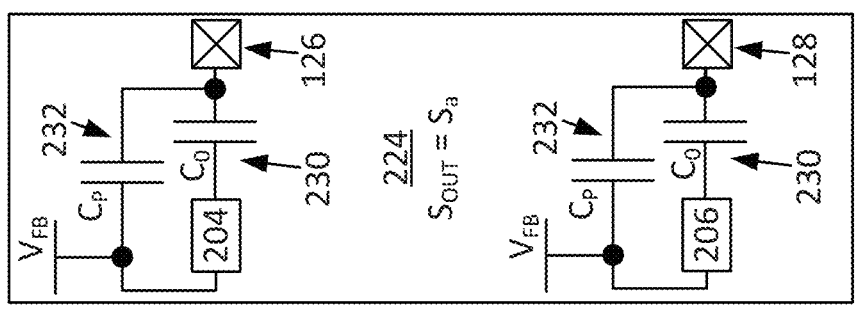
FIG. 2 is a block diagram that illustrates the small signal model of a capacitive sensor circuit that may be used as an input device of the signal buffering system of FIG. 1, in accordance with one of a number of embodiments.

FIG. 2 shows the small signal model 224 of an embodiment sensor circuit that can be used as the input device 124 of FIG. 1. The model circuit 224 includes a first signal 204 and a second signal 206 that are each generated by a respective voltage signal generator connected to a fixed bias voltage $V_{FB}$ and that together generate a differential pair of signals that are respectively provided to terminals 126 and 128. In other embodiments, other voltage signal generators that are not sensors may be used.

Referring again to FIG. 2, terminals 126 and 128 are respectively coupled to receive signals 204 and 206 by an output capacitor 230 having a capacitance $C_0$, which is the capacitance of each sensor at rest, and are each respectively coupled to $V_{FB}$ by a parasitic capacitor 232 having a capacitance $C_p$. In an embodiment, model circuit 224 models a capacitive sensor such as a microphone that provides better performance when it is biased in a constant-charge configuration by being connected to high impedance nodes. In an embodiment, signals 204 and 206 are generated by the capacitance variation of a movable membrane and two fixed plates of a double back-plate MEMS device. In some such embodiments, a constant-charge configuration may be maintained by connecting the terminals 126 and 128 to high impedance nodes.

Figure 3:
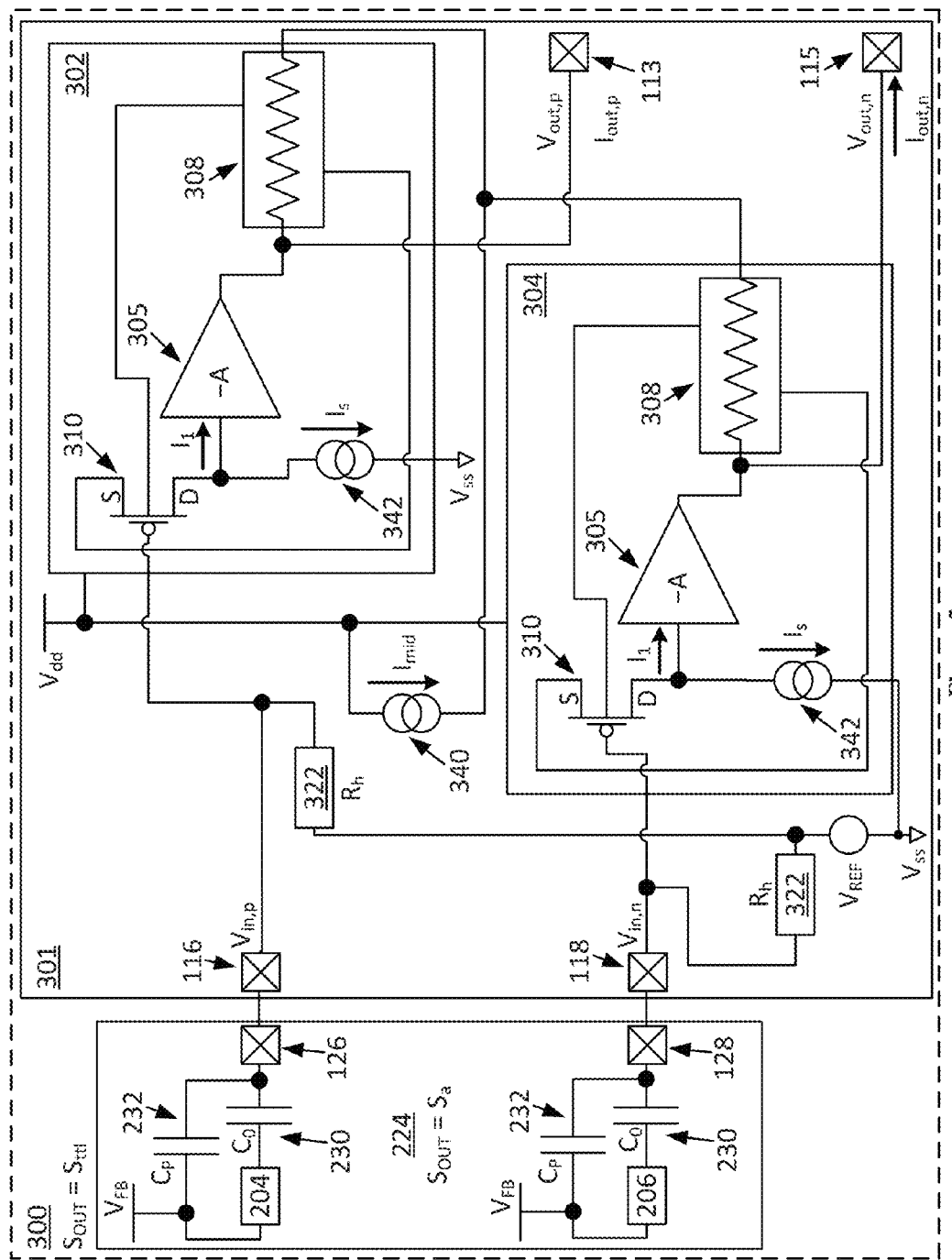
FIG. 3 is a block diagram that illustrates an amplifier circuit that uses current feedback and maintains the sensor circuit of FIG. 2 in a constant-charge configuration, in accordance with one of a number of embodiments.

FIG. 3 illustrates an embodiment amplification system 300, which may be used as the signal buffering system 100 of FIG. 1, and which implements buffer circuit 101 as an amplifier circuit 301 that is capable of providing either a positive-dB or negative-dB voltage gain. Amplifier circuit 301 implements high-impedance stages 102 and 104 as amplifier single-ended circuits 302 and 304 and uses current feedback to provide the voltage gain to the differential signal from sensor circuit 224. In other embodiments, any circuit having differential components that may be modeled as a variable capacitance connected in parallel with a parasitic capacitance may be used as the input device to amplifier circuit 301.

Referring again to FIG. 3, at output terminal 113, single-ended circuit 302 provides a first pseudo-differential amplifier output signal having a voltage $V_{out,p}$ and a current $I_{out,p}$. At output terminal 115, single-ended circuit 304 provides a second pseudo-differential amplifier output signal having a voltage $V_{out,n}$ and a current $I_{out,n}$.

Each of the single-ended circuits 302 and 304 respectively includes an input transistor 310 that is a p-channel transistor such as, for example, a p-channel Metal Oxide Semiconductor (PMOS) transistor. Each of the single-ended circuits 302 and 304 also respectively includes a current source 342 connected to the drain of transistor 310 to bias it with a current $I_s$, and an inverting output stage 305 also connected to the drain of transistor 310 that receives a current $I_1$ from the drain of transistor 310.

The inverting output stages 305 are inverting amplifiers that each provide either a voltage gain of –A from the input voltage to the output voltage, or a trans-resistance gain of –A from the input current $I_1$ to the output voltage. It may be implemented in various embodiments as class A output stages, class AB output stages, or any other type of inverting output stage known in the art. In an embodiment, a low-ohmic input node, such as, e.g., the source of a transistor, is used as the input node for inverting output stage 305. In other embodiments, a high impedance input, such as, e.g., the gate of a transistor, is used as the input node for inverting output stage 305.

Referring again to FIG. 3, input terminal 116 is connected to the gate of transistor 310 of single-ended circuit 302, and provides it a first differential amplifier input signal having a voltage $V_{in,p}$. Input terminal 118 is similarly connected to the gate of the transistor 310 of single-ended circuit 304 and provides it a second differential amplifier input signal having a voltage $V_{in,n}$ that is the negative of $V_{in,p}$. To provide gate voltage bias and to allow signal swing at the gates of each of input transistors 310, these gates are also each connected via a respective high-ohmic resistance stage 322 to voltage $V_{REF}$. High-ohmic resistance stages 322 each have a resistance $R_h$ chosen such that $$\frac{1}{2\pi R_h C_o} < f_{min},$$

where $f_{min}$ is the lowest frequency of the signal bandwidth.

A respective resistance network 308 is included in each of single-ended circuits 302 and 304. In an embodiment, the resistance networks 308 are implemented using e.g., potentiometers, switched networks of resistors, or other variable resistances in order to provide a configurable voltage gain or attenuation. Such a configurable embodiment allows adjustment of the divided voltages provided to either the source or the body of each transistor 310. In other embodiments, the resistance networks 308 are implemented as voltage dividers made up of multiple fixed resistors connected in series.

Referring again to FIG. 3, the two resistance networks 308 of amplifier circuit 301 are connected to each other at a common node to form a single resistance network, and the two single-ended circuits 302 and 304 are thereby connected together. In single-ended circuit 302, the resistance network 308 is connected between this common node and the output of the inverting output stage 305, which is also connected to the output terminal 113 of amplification circuit 301. Similarly, in single-ended circuit 304, the resistance network 308 is connected between this common node and the output of the inverting output stage 305, which is also connected to the output terminal 115 of amplification circuit 301. The common node that connects the respective resistance networks 308 of single-ended circuits 302 and 304 is also connected to a current source 340 that provides a current $I_{mid}$ to each of the resistance networks 308 so that it may be used as bias current for transistor 310.

In each of the single-ended circuits 302 and 304, respectively, the resistance network 308 is also connected to the source of transistor 310 such that, in some embodiments, a divided voltage is provided to the source of transistor 310, relative to the voltage across the entire resistance network 308. Additionally, in each of the single-ended circuits 302 and 304, respectively, the resistance network 308 is also connected to the body of transistor 310 such that, in some embodiments, a divided voltage is provided to the body of transistor 310, relative to the voltage across the entire resistance network 308. These resistance networks 308 thus provide feedback paths that allow the amplifier circuit 301 to provide a positive-dB voltage gain or negative-dB voltage gain, i.e., an attenuation.

The amplifier circuit 301, which is pseudo-differential, provides a pair of output signals at output terminals 113 and 115. If a common mode signal is applied on the input terminals 116 and 118 of amplifier circuit 301, it will appear on the output terminals 113 and 115 with a 0 dB voltage gain. Since the multiplier A has a large value, the negative feedback of the single-ended circuits 302 and 304 senses $I_1$ and forces it to be almost zero; for this reason it may be described as a current feedback. By configuring the amplifier circuit 301 for positive-dB voltage gain, the amplification system 300 may achieve a target output sensitivity $S_{tt}$, even when the output sensitivity $S_a$ of sensor device 224 is less than $S_{tt}$. In an embodiment, the positive-dB voltage gain of amplifier circuit 301 can be increased to compensate for reduced sensitivity $S_a$ that is caused by a reduction of back-volume of sensor circuit 224.

Figure 4:
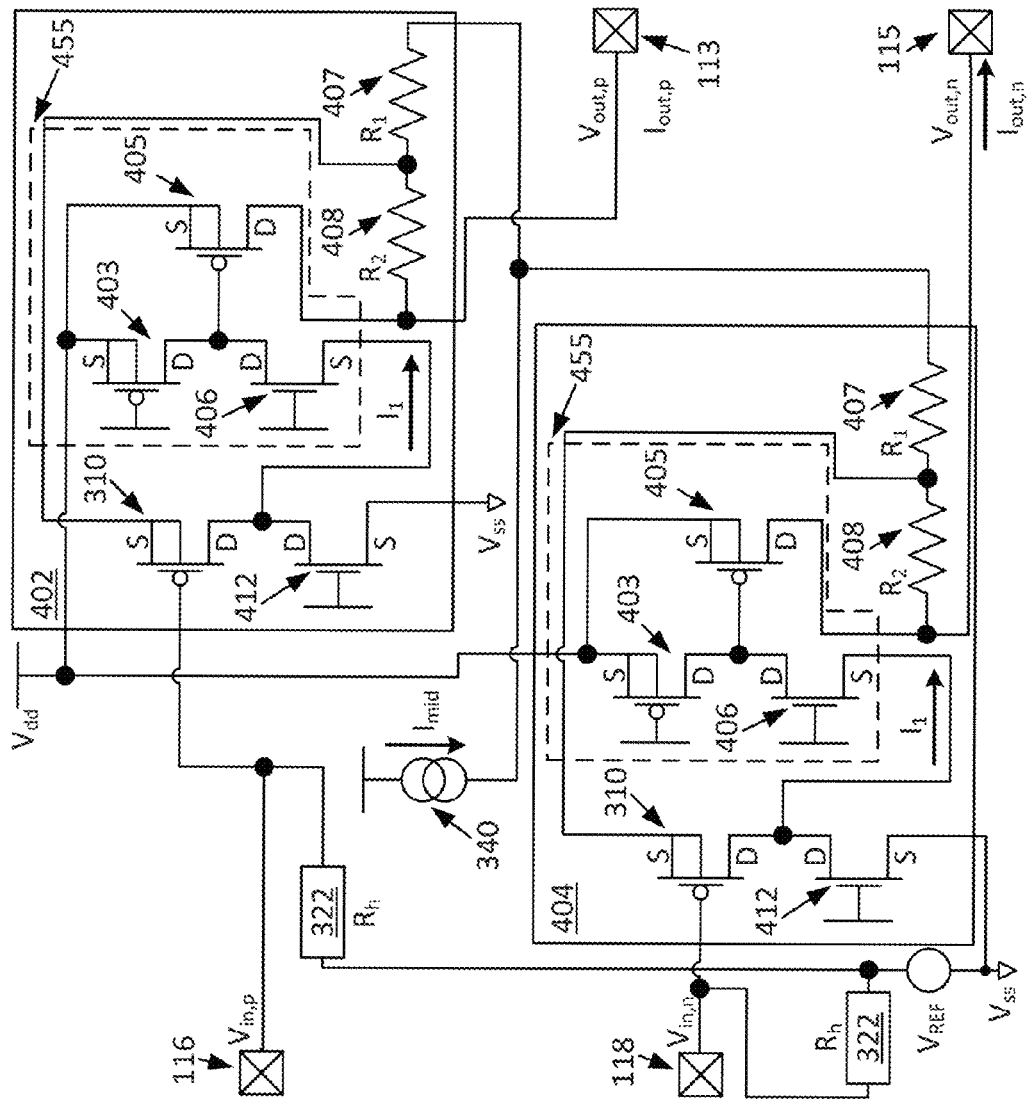
FIG. 4 is a block diagram that illustrates an amplifier circuit that may be used as the amplifier circuit of FIG. 3, in accordance with embodiments of the present invention.

FIG. 4 illustrates embodiment amplifier single-ended circuits 402 and 404, which may be used as the single-ended circuits 302 and 304 of FIG. 3. A respective feedback resistor 408 is included in each of single-ended circuits 402 and 404 and has a resistance $R_2$. Another resistor 407 is included in both circuits 402 and 404 and has a resistance $R_1$. It is connected between the source of transistor 310 and the common node between the 2 amplifiers. The output terminal 113 is connected to the feedback resistor 408 of single-ended circuit 402, and the output terminal 115 is similarly connected to the feedback resistor 408 of single-ended circuit 404. In some embodiments, a respective current source is also connected between $V_{ss}$ and each of output terminals 113 and 115 to provide current sinking.

Referring again to FIG. 4, in each of circuits 402 and 404 a resistance network formed by resistors 407 and 408 feeds back the output signal to a source terminal of transistor 310, which is also connected to the body terminal of transistor 310. The signal that is fed back is scaled according to a pre-determined fraction of the output signal, where a reciprocal of this fraction has the value $1+R_2/R_1$. The resistors $R_1$ and $R_2$ thus allow the amplifier circuit 301 (shown in FIG. 3) to provide a voltage gain from the differential input $V_{in,p}-V_{in,n}$ to the differential output $V_{out,p}-V_{out,n}$ equal to $1+R_2/R_1$, which may be varied from 0 dB to higher positive values. In some embodiments, configuring the single-ended circuits 402 and 404 for positive-dB voltage gain allows the amplification system 300 (shown in FIG. 3) to achieve a target output sensitivity $S_{ttl}$ even when the output sensitivity $S_a$ of sensor device 224 is less than $S_{ttl}$.

Referring again to FIG. 4, each of the single-ended circuits 402 and 404 includes a current biasing transistor 412 that acts as a constant current source for the input transistor 310. Each of the single-ended circuits 402 and 404 includes a class-A output stage 455 that includes a cascode transistor 406, a constant current source provided by a current biasing transistor 403, and an output transistor 405. In the embodiment of FIG. 4, current biasing transistors 412 and cascode transistors 406 are implemented as n-channel Metal Oxide Semiconductor (NMOS) transistors, while current biasing transistors 403 and output transistors 405 are implemented as PMOS transistors.

Referring again to FIG. 4, each of current biasing transistors 412 also has its respective source connected to rail voltage $V_{ss}$. Each of the current biasing transistors 403 and the output transistors 405 has, respectively, its source connected to rail voltage $V_{dd}$ and its body interconnected with its source. In an embodiment, supply voltage $V_{dd}$ is also the maximum output voltage of single-ended circuits 402 or 404.

In each of single-ended circuits 402 and 404, respectively, the input transistor 310 has its drain connected to the drain of current biasing transistor 412 and to the source of the cascode transistor 406. Also in each of single-ended circuits 402 and 404, respectively, the drain of the cascode transistor 406 is connected to the drain of the current biasing transistor 403 and to the gate of the output transistor 405. The drain of the output transistor 405 of the single-ended circuit 402 is connected to both the output terminal 113 and to the feedback resistor 408 of single-ended circuit 402. The drain of the output transistor 405 of the single-ended circuit 404 is connected to both the output terminal 115 and to the feedback resistor 408 of single-ended circuit 404.

In each of single-ended circuits 402 and 404, respectively, the feedback resistor 408 is connected to provide negative feedback from the output of the amplifier stage to the source of the input transistor 310, which is also connected to a resistor 407 having a resistance of $R_1$. The resistors 407 of single-ended circuits 402 and 404 are connected to each other, such that the source of the input transistor 310 of single-ended circuit 402 is connected to the input transistor 310 of single-ended circuit 404 via the two resistors 407 in between. In each of single-ended circuits 402 and 404, respectively, the negative feedback built around the input transistor 310 prevents its current from varying so that the voltages of the gate and source of the input transistor 310 change by the same amount when a signal is applied to the gate.

In each of single-ended circuits 402 and 404, a current $I_1$ flows through the cascode transistors 406, and the negative feedback senses $I_1$ and forces it to be almost zero due to the large gain multiplier A of single-ended circuits 402 and 404. Because $I_1$ is approximately equal to zero, when a differential signal is applied to the inputs of single-ended circuits 402 and 404, the difference $V_{out,p}-V_{out,n}$ between the positive and negative output voltages will be in accordance with Equation 2:

$$V_{out,p} - V_{out,n} = (V_{in,p} - V_{in,n}) \cdot \left(1 + \frac{R_2}{R_1}\right) \quad \text{(Eq. 2)}$$

Thus, single-ended circuits 402 and 404 provide a precise voltage gain by using a ratio of resistances $R_2$ and $R_1$. If the resistances $R_1$ and $R_2$ are chosen to be small they will contribute little noise to the outputs $V_{out,p}$ and $V_{out,n}$. In the embodiment of FIG. 4, class A output stages 455 are used, but in other embodiments class-AB output stages may be used so that the output of each of single-ended circuits 402 and 404 is able to sink and source a current equal to $V_{dd}/(2R_1+2R_2)$.

Resistors 407 and 408 will increase amplifier power consumption during high signal swings, but in many applications, including, e.g., normal use of a mobile phone microphone, such rail-to-rail signals are not often reached. Moreover, because resistors 407 and 408 are not connected to ground, they do not impact the DC power consumption.

Referring again to FIG. 4, if the bias current of the input transistor 310 were solely provided by the output transistor 405, this current flowing through resistor 408 would create a voltage drop on resistor 408 and thus cause an equal reduction of the output voltage swing. To prevent this loss of output voltage swing, current source 340 provides at least a portion of the bias current of the input transistor 310. The current $I_{mid}$ provided by current source 340 may have a relatively higher noise level, since this common mode noise will be canceled in the pseudo-differential outputs $V_{out,p}$ and $V_{out,n}$. In some embodiments, the single-ended circuits 402 and 404 may provide a rail-to-rail output swing even when their voltage gain is close to 0 dB.

Figure 5A:
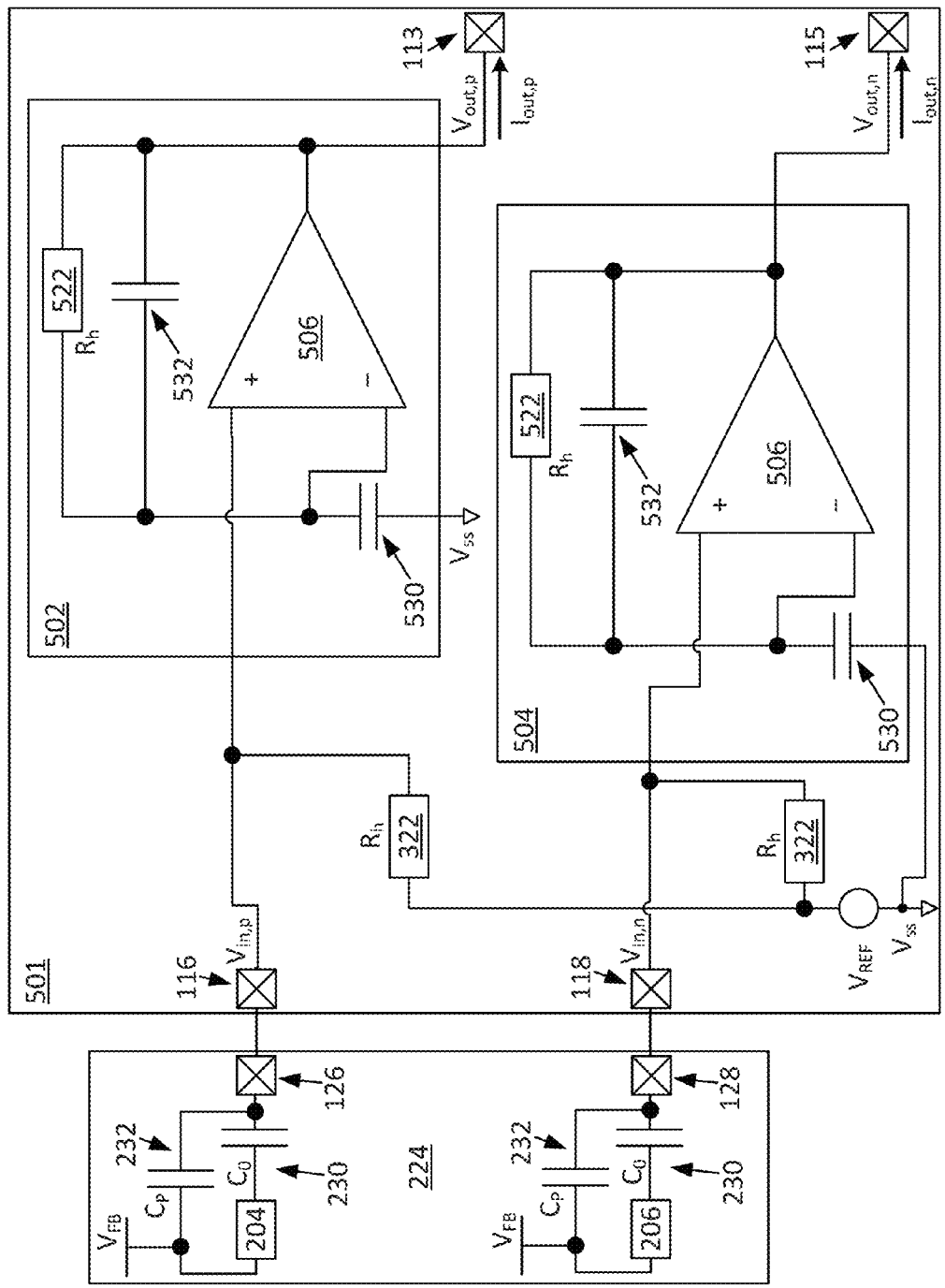
FIG. 5A is a block diagram that illustrates an example amplifier circuit having a differential amplifier stage that may be used to maintain the sensor circuit of FIG. 2 in a constant-charge configuration.

FIG. 5A illustrates an example amplifier circuit 501 that may be used as the buffer circuit 101 of FIG. 1 to provide a voltage gain while maintaining a sensor device 224 in a constant-charge configuration. Amplifier circuit 501 includes amplifier single-ended circuits 502 and 504, each of which respectively includes a differential amplifier 506, a first capacitor 530, a second capacitor 532, and a resistor 522 that has resistance $R_h$.

In amplifier circuit 501, capacitors 530 and 532 are used as gain elements, and thus it is necessary to connect them to nodes having high input impedances. In each of the single-ended circuits 502 and 504, respectively, the first capacitor 532 is connected between the negative input of the differential amplifier 506 and the output of the differential amplifier 506, and the first capacitor 530 is connected between the negative input and voltage $V_{ss}$. The resistors 522 of each of the single-ended circuits 502 and 504 are connected in parallel with the second capacitor 532.

The positive input of the differential amplifier 506 of single-ended circuit 502 is connected to input terminal 116, and the output of this differential amplifier is connected to output terminal 113. Similarly, the positive input of the differential amplifier 506 of single-ended circuit 504 is connected to input terminal 118, and the output of this differential amplifier is connected to output terminal 115.

As shown in FIG. 5B, each differential amplifier 506 of the amplifier circuit 501 includes two input transistors 110—one for each of its positive and negative differential inputs. Relative to single-ended circuits 302 and 304 of FIG. 3, the amplifier circuit 501 of FIG. 5A therefore uses twice as many input transistors in single-ended circuits 502 and 504, resulting not only in a reduction in SNR, but also causing an increase in total power consumption, since a bias current is required to reduce thermal noise for each such transistor.

Figure 6:
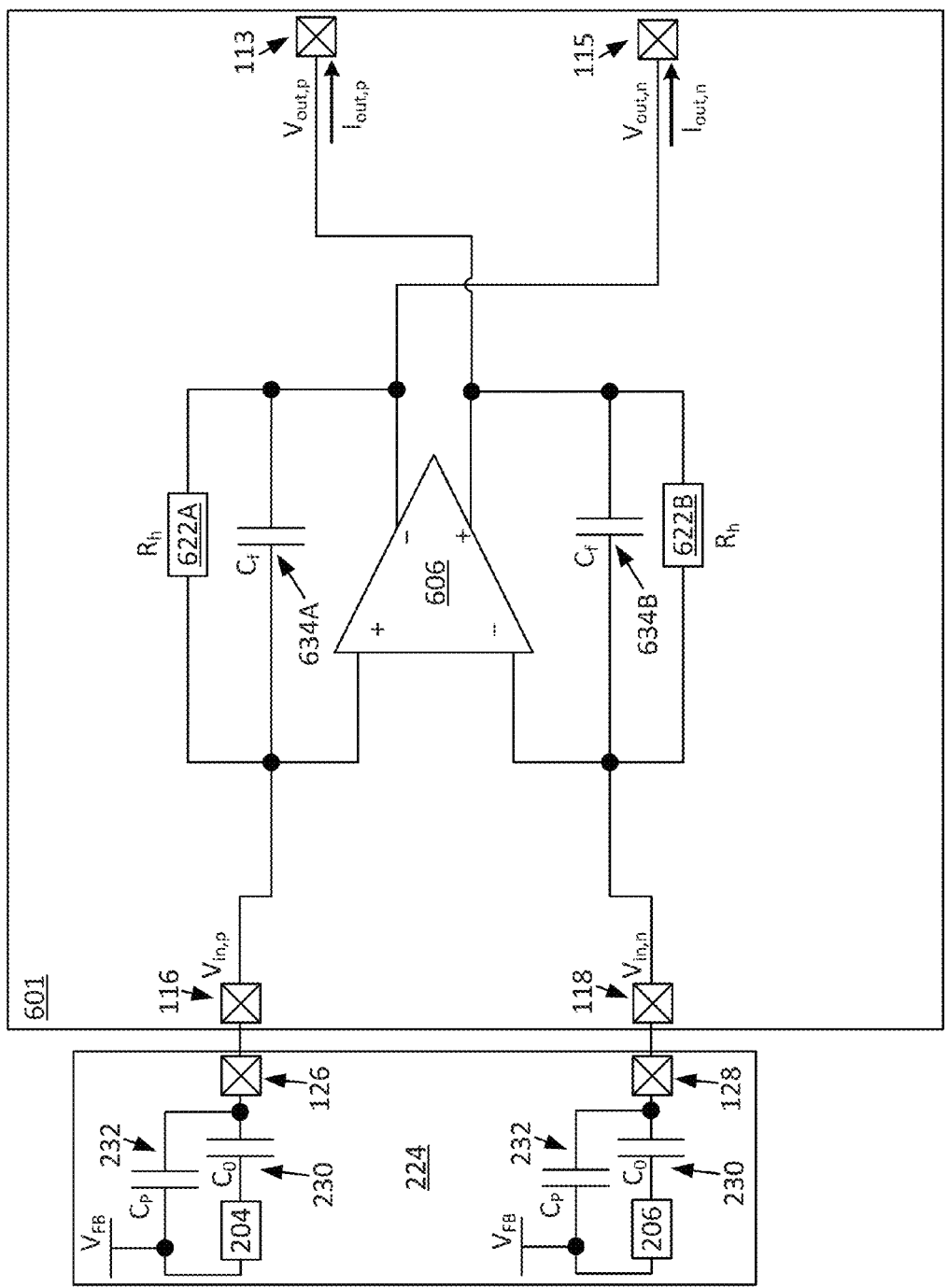
FIG. 6 is a block diagram that illustrates another example amplifier circuit that may be used to maintain the sensor circuit of FIG. 2 in a constant-voltage configuration.

FIG. 6 illustrates another example amplifier circuit 601 that may be used as the buffer circuit 101 of FIG. 1, but which is configured for maintaining a sensor circuit 224 in a constant voltage configuration instead of a constant charge configuration. The amplifier circuit 601 includes a differential amplifier stage 606 that acts as a virtual ground for the sensor circuit 224 as it receives the pair of differential input signals at input terminals 116 and 118 and provides a pair of differential output signals to output terminals 113 and 115. The amplifier circuit 601 maintains a constant voltage across the sensor circuit 224.

Referring again to FIG. 6, a resistor 622A having resistance $R_h$ and a capacitor 634A having a capacitance $C_f$ are connected in parallel between the negative output and the positive input of the differential amplifier stage 606. Additionally, a resistor 622B having resistance $R_h$ and a capacitor 634B having capacitance $C_f$ are also connected in parallel between the positive output and the negative input of the differential amplifier stage 606.

The output voltage noise $V_{n\_out}$ of amplifier circuit 601 could be approximated as varying with the input-referred voltage noise $V_{n\_in}$ of each of the differential inputs of differential amplifier stage 606 in accordance with Equation 3, where $C_p$ includes also the parasitic capacitance of the input devices of the amplifier:

$$V_{n,out}^2 \approx 2 * \left(V_{n\_in}\left(1 + \frac{C_o + C_p}{C_f}\right)\right)^2 \quad \text{(Eq. 3)}$$

Comparing Equations 1 and 3, the output voltage noise $V_{n\_out}$ of the amplifier circuit 601 is greater by a factor of approximately $$\left(\left(1 + \frac{C_o + C_p}{C_f}\right)\right)^2$$

relative to implementations of buffer circuit 101 using a simple source follower or super source follower stage that does not have a voltage gain. If $C_p \ll C_0$ and a gain of 0 dB is desired, this results in an SNR loss of approximately 6 dB when the amplifier circuit 601 is used as buffer circuit 101.

Figure 7:
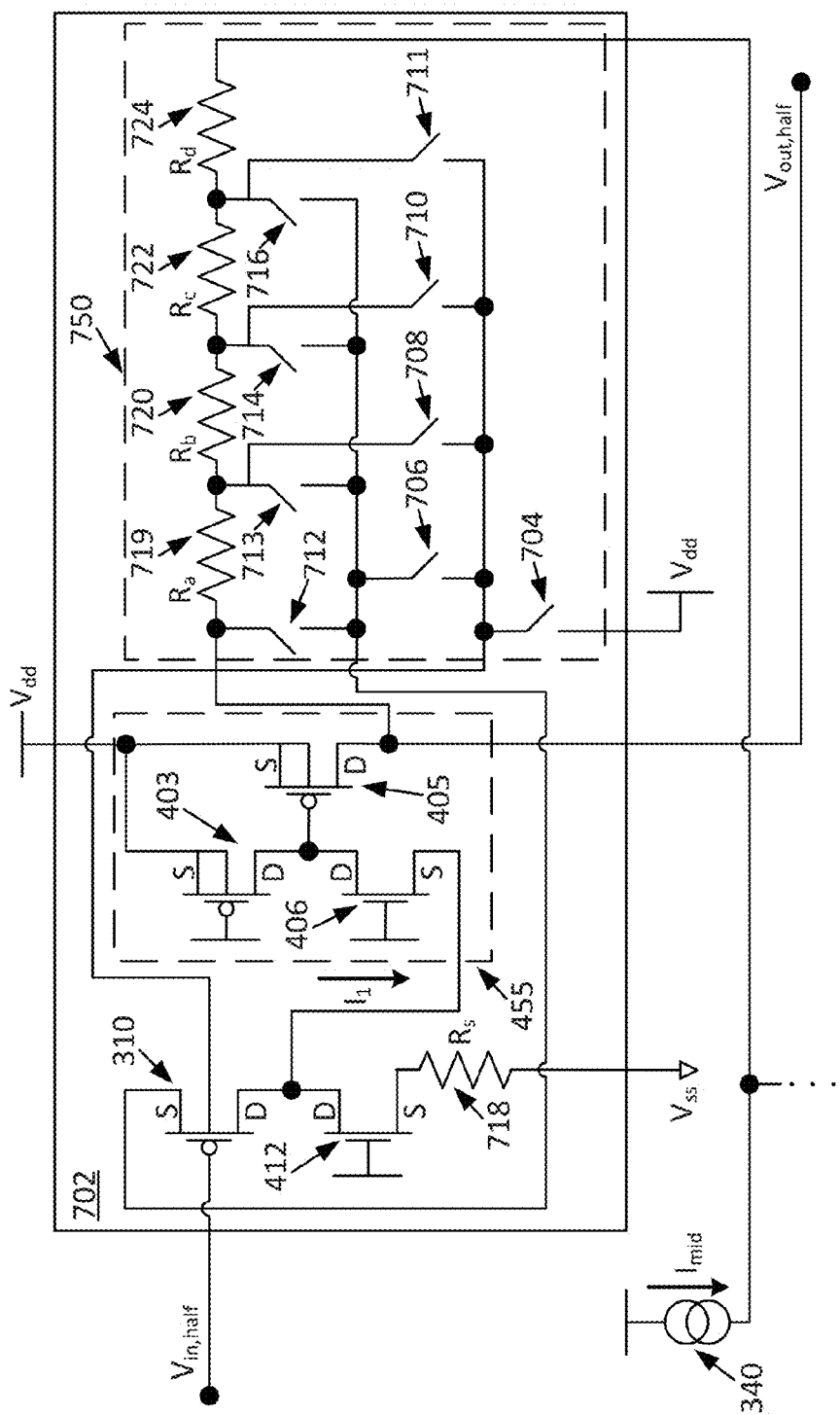
FIG. 7 is a block diagram that illustrates a configurable amplifier single-ended circuit that may be used in the amplifier circuit of FIG. 4, in accordance with one of a number of embodiments.

FIG. 7 illustrates an embodiment amplifier single-ended circuit 702 that may be used as the single-ended circuit 302 or the single-ended circuit 304 of FIG. 3 to provide a configurable positive-dB or negative-dB voltage gain. Single-ended circuit 702 receives an input signal having a voltage $V_{in,half}$ and provides an output signal having a voltage $V_{out,half}$.

The voltage gain between $V_{in,half}$ if and $V_{out,half}$ is determined by a resistance network 750 that is included in single-ended circuit 702, which includes a resistive string made up of resistors 719, 720, 722, and 724, and also includes switches 704, 706, 708, 710, 711, 712, 713, 714, and 716. Resistors 719, 720, 722, and 724, which have respective resistances of $R_a$, $R_b$, $R_c$, and $R_d$, are connected in series between the output of the class-A output stage 455 and the current source 340. Switches 713, 714, and 716 are connected to the source of transistor 310 and to respective nodes in between resistors 719, 720, 722, and 724, and switch 712 is connected between the source of transistor 310 and the output of the class-A output stage 455. Switches 708, 710, and 711 are connected to the body of transistor 310 and to respective nodes in between resistors 719, 720, 722, and 724, and switch 706 is connected between the source of transistor 310 and the body of transistor 310. Switch 704 is connected between the body of transistor 310 and $V_{dd}$, and may be used to couple the body to $V_{dd}$. A degeneration resistor 718 having a resistance $R_s$ is included in single-ended circuit 702 between the source of transistor 412 and $V_{SS}$. In an embodiment, the resistance $R_s$ it trimmable with the voltage gain of single-ended circuit 702. In other embodiments, transistor 412 may be omitted and the degeneration resistor 718 may be coupled directly to the drain of transistor 310. Such embodiments may be appropriate, for example, for implementations in which a different output stage having a higher input impedance (e.g., the gate of a transistor) is substituted for output stage 455.

Figure 8:
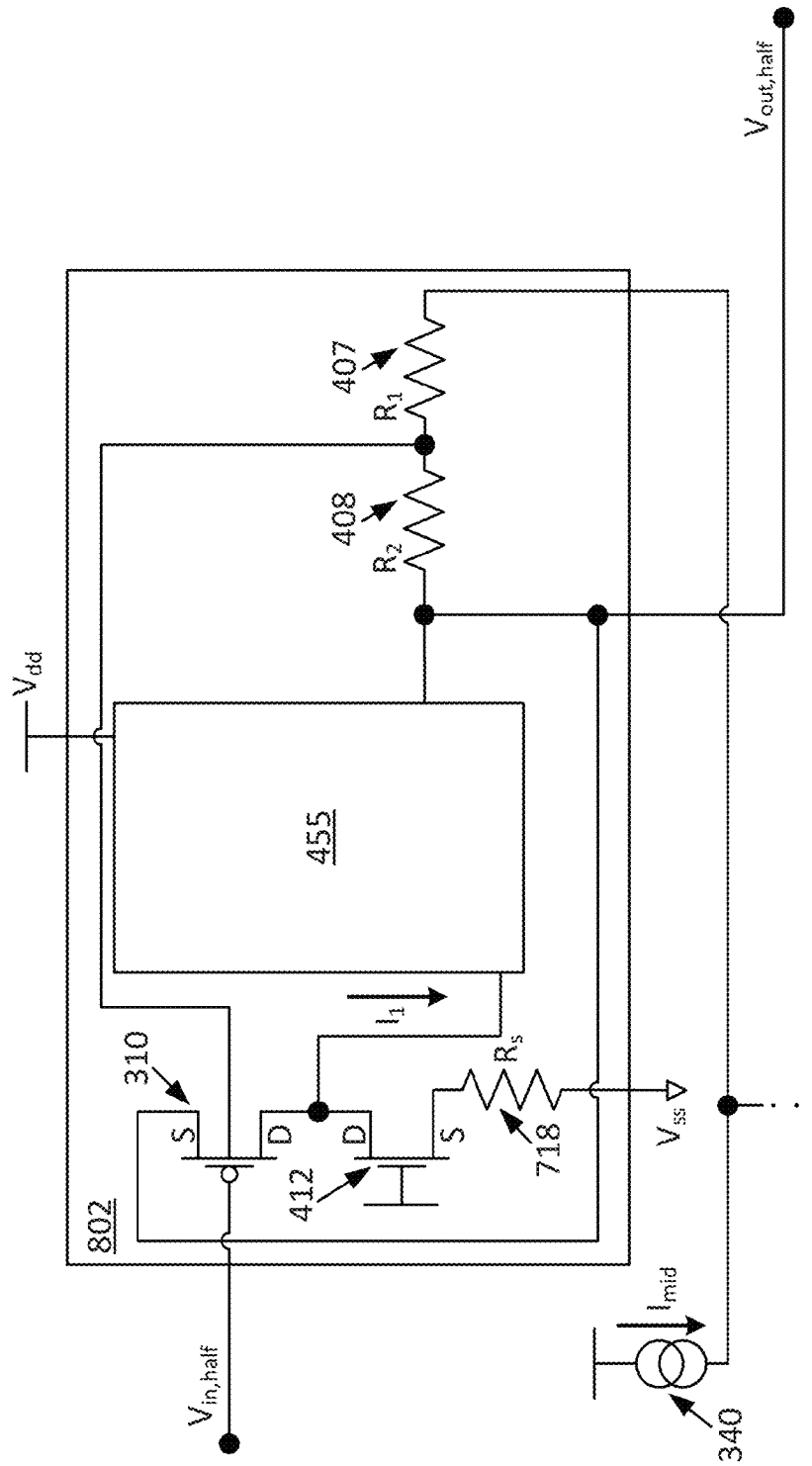
FIG. 8 is a block diagram that illustrates an embodiment of the amplifier single-ended circuit of FIG. 7 that uses a transistor body effect to configure the voltage gain, in accordance with one of a number of embodiments.

Referring again to FIG. 7, the voltage gain supported by single-ended circuit 702 may be trimmed by shorting a combination of the switches 712, 713, 714, and 716 and the switches 704, 706, 708, 710, and 711 using, for example, static configuration bits. In an embodiment, the body of transistor 310 is permanently shorted to its source with the switch 706, and the source of transistor 310 is connected to a tapping point of the resistor string by shorting one of the switches 712, 713, 714, or 716; in some such embodiments, the resistance $R_s$ may also be set to zero, resulting in a circuit equivalent to one of the single-ended circuits 402 and 404 of FIG. 4, where resistance $R_2$ is the resistance between the output of the class-A output stage 455 and the tapping point of the switched resistance network 750, and resistance $R_1$ is the resistance between the tapping point and the output $V_{out,half}$ of single-ended circuit 702. When switches 706 and 712 are shorted, the single-ended circuit 702 is a super source follower. When switch 712 and one of switches 708, 710, or 711 of single-ended circuit 702 is shorted to connect the body of transistor 310 to a tapping point of the resistor string, the equivalent single-ended circuit 802 that results is shown in FIG. 8, where resistance $R_2$ is the resistance between the output of the class-A output stage 455 and the tapping point of the switched resistance network 750, and resistance $R_1$ is the resistance between the tapping point and the output of single-ended circuit 702.

The components that contribute to the output noise of single-ended circuit 702 include transistors 310, 403, and resistor 718. In embodiments of single-ended circuit 702 in which resistances $R_1$ and $R_2$ are determined by tapping the switched resistance network 750 (as previously described), these resistances $R_1$ and $R_2$ also contribute to the thermal output noise $V_{n\_out}$ in accordance with Equation 4, where $g_{m\_310}$ and $g_{m\_403}$ are the respective transconductances of transistors 310 and 403:

$$V_{n\_out}^2 = 4kTR_2\left(1+\frac{R_2}{R_1}\right) + 4kT\frac{2}{3}\frac{1}{g_{m\_310}}\left(1+\frac{R_2}{R_1}\right)^2 + \quad \text{(Eq. 4)}$$

$$4kT\frac{1}{R_s}\left[\frac{1}{g_{m\_310}}\left(1+\frac{R_2}{R_1}\right)+R_2\right]^2 +$$

$$4kT\frac{2}{3}g_{m\_403}\left[\frac{1}{g_{m\_310}}\left(1+\frac{R_2}{R_1}\right)+R_2\right]^2$$

In some such embodiments, although the output noise $V_{n\_out}$ of single-ended circuit 702 is dependent on the value of $$1+\frac{R_2}{R_1},$$

the value of $R_1+R_2$ may be maintained within pre-determined limits even as the voltage gain is adjusted, so that the stability and current consumption of single-ended circuit 702 does not change from one voltage gain configuration to another. The degeneration resistor 718 gives a degree of freedom in the design of single-ended circuit 702 to maintain low noise in multiple gain configurations. The resistance $R_s$ may be adjusted in some embodiments to reduce the noise for relatively high-gain configurations of single-ended circuit 702 in which the input swing is lower than the output swing, such that a higher $R_s$ may be used without compromising linearity.

In other embodiments of single-ended circuit 702 in which resistances $R_1$ and $R_2$ are determined using switched resistance network 750, the input referred noise $V_{n\_in}$ of single-ended circuit 702 is maintained within pre-determined limits for different values of $$1+\frac{R_2}{R_1}.$$

The input referred noise $V_{n\_in}$ may be determined from Equation 4 by dividing $V_{n\_out}$ by the voltage gain of single-ended circuit 702. For example, where $$1+\frac{R_2}{R_1}$$

is the voltage gain of single-ended circuit 702 (as is the case for amplifier single-ended circuits 402 or 404 of FIG. 4), $V_{n\_in}$ is therefore in accordance with Equation 5, which shows that a lower value of $$R_1 \parallel R_2 = \frac{R_1 R_2}{R_1 + R_2}$$

results in a lower input referred noise $V_{n\_in}$:

$$V_{n\_in}^2 = 4kT\left\{\frac{R_1 R_2}{R_1 + R_2} + \frac{2}{3}\frac{1}{g_{m\_310}} + \left[\frac{1}{g_{m\_310}}\left(\frac{1}{g_{m\_310}}\frac{1}{R_s}\right)+\right.\right. \quad \text{(Eq. 5)}$$

$$\frac{1}{R_s}\left(\frac{R_1 R_2}{R_1+R_2}\right)^2 + 2\frac{R_1 R_2}{R_1+R_2}\left(\frac{1}{g_{m\_310}}\frac{1}{R_s}\right)\right] +$$

$$\left.g_{m\_403}\left[\frac{1}{g_{m\_310}^2}+\left(\frac{R_1 R_2}{R_1+R_2}\right)^2 + \frac{2}{g_{m\_310}}\frac{R_1 R_2}{R_1+R_2}\right]\right\}$$

In such embodiments, since the resistances $R_1$ and $R_2$ contribute to the noise, their value may be chosen to be small relative to $g_{m\_310}$.

FIG. 8 illustrates the amplifier single-ended circuit 802 that results when switch 712 and one of switches 708, 710 or 711 of single-ended circuit 702 (shown in FIG. 7) is shorted. Referring to FIG. 8, single-ended circuit 802 is only different from single-ended circuits 402 or 404 of FIG. 4 in that the source of transistor 310 is no longer shorted to its body, but is instead connected to the output of the single-ended circuit 802. The body of transistor 310 now receives a lower signal than its source, so that input transistor 310 of single-ended circuit 802 exhibits a programmable body-effect, to be described further in connection with FIG. 9B. In an embodiment, since the body of transistor 310 is driven with a signal smaller than the source, the source-body pn-junction of transistor 310 is constrained from being biased more than a pre-determined maximum value $V_d$ (e.g., 0.4V), by adhering to the constraint of Equation 6:

$$V_{dd} < \left[V_d + \frac{I_{mid}}{2}R_2\right] \cdot 2\frac{R_1 + R_2}{R_2} \quad \text{(Eq. 6)}$$

Even if the source-body pn-junction of transistor 310 becomes forward biased, the current through transistor 310 is still constrained by the resistive load and will never exceed the value $I_{max}$ given by Equation 7:

$$I_{max} = \frac{V_{dd} - V_d}{2*R_1 + R_2} \quad \text{(Eq. 7)}$$

Figure 9:
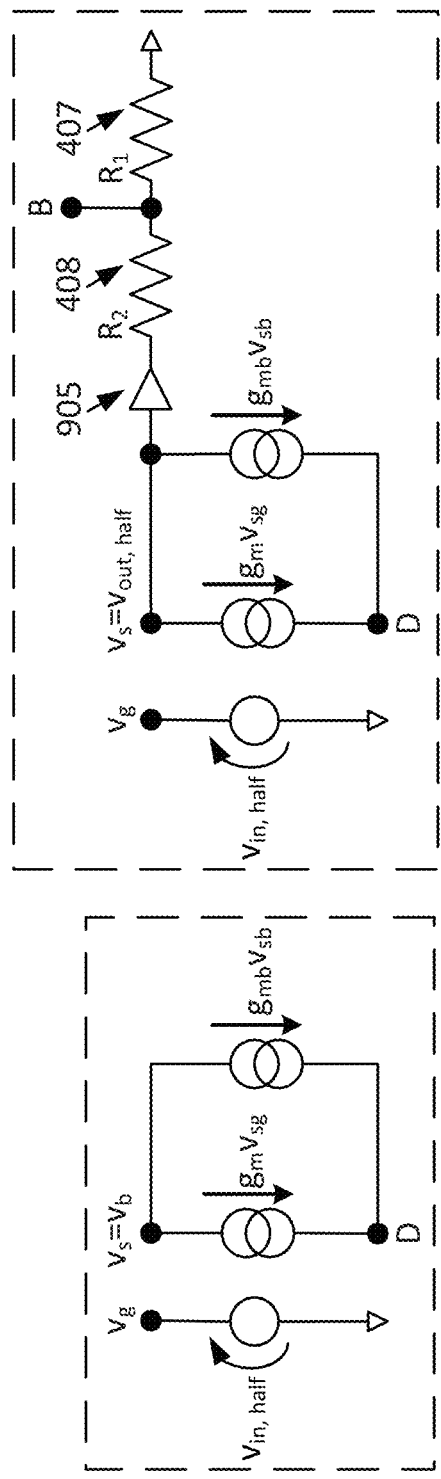
FIG. 9A is a block diagram that illustrates an equivalent small-signal circuit for a single-ended circuit of the amplifier circuit of FIG. 8; in accordance with one of a number of embodiments.
FIG. 9B is a block diagram that illustrates an equivalent small-signal circuit for the amplifier single-ended circuit of FIG. 8, in accordance with one of a number of embodiments.

FIG. 9A illustrates an equivalent circuit 900A for transistor 310 as implemented in single-ended circuit 402 or 404 of FIG. 4, while FIG. 9B illustrates an equivalent circuit 900B for transistor 310 as implemented in the single-ended circuit 802 of FIG. 8. In both circuit 900A and circuit 900B, transconductances $g_m$ and $g_{mb}$ have positive values, and because feedback forces the current of transistor 310 to remain approximately constant, currents $g_m v_{sg}$ and $g_{mb} v_{sb}$ do not flow into any element.

In circuit 900A, the transistor source is shorted to its body, i.e., source voltage $v_s$ is equal to body voltage $v_b$. Thus, in circuit 900A, no body effect is present, and the source voltage $v_s$ is equal to the gate voltage $v_g$ and to the input voltage $v_{in,half}$.

In circuit 900B of FIG. 9B, the source is connected to a buffer 905. The buffer 905 represents the drive capability provided by the class-A output stage 455 as implemented in the single-ended circuit 802 of FIG. 8. This buffer 905 drives a voltage divider formed by resistors 407 and 408. Resistor 407 is connected to resistor 408 at the transistor body, such that the body voltage $v_b$ is a fraction $$\frac{1}{G}$$

of the source voltage $v_s$, in accordance with Equation 8:

$$v_b = \frac{v_s}{G} = v_s \frac{R_1}{R_1 + R_2} \quad \text{(Eq. 8)}$$

Referring again to FIG. 9B, the output voltage $v_{out,half}$ is equal to the source voltage $v_s$. This source voltage $v_s$ of FIG.

9B may be determined in accordance with Equation 9, which shows that if the voltage gain G is greater than 1, then $v_s$ is less than $v_{in}$:

$$v_s = v_{in} \frac{g_m}{g_{mb} \frac{G-1}{G} + g_m} \quad \text{(Eq. 9)}$$

Figure 10:
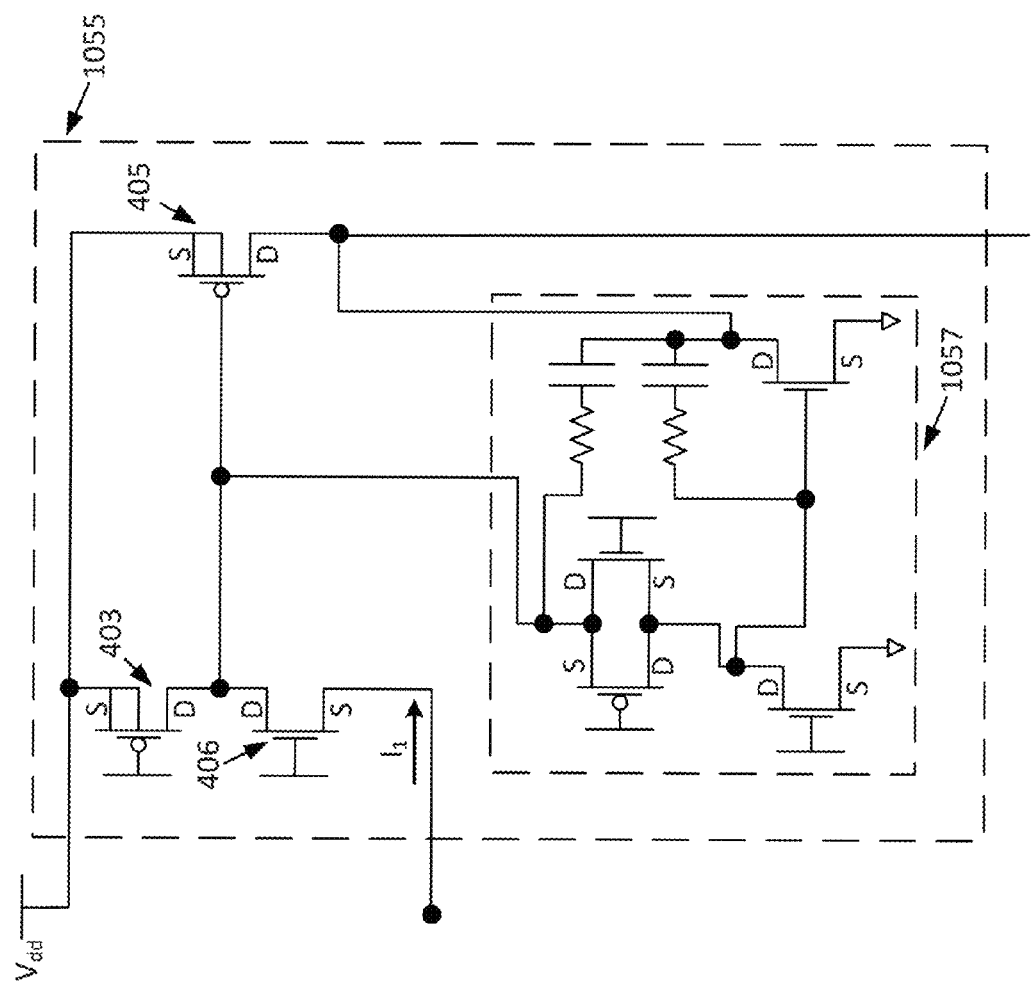
FIG. 10 is a graph that illustrates an embodiment class-AB output stage that may be used in the amplifier single-ended circuits of FIGS. 4, 7, and 8, in accordance with one of a number of embodiments.

FIG. 10 illustrates an embodiment class-AB output stage 1055 that may be substituted for the class-A output stage 455 in any of FIG. 4, 7, or 8. The only difference between class-AB output stage 1055 and the class-A output stage 455 is that class-AB output stage includes a current-sinking circuit 1057. The inclusion of the current-sinking circuit 1057 allows the class-AB output stage 1155 to drive amplifier gain resistances without needing a high quiescent current.

Figure 11:
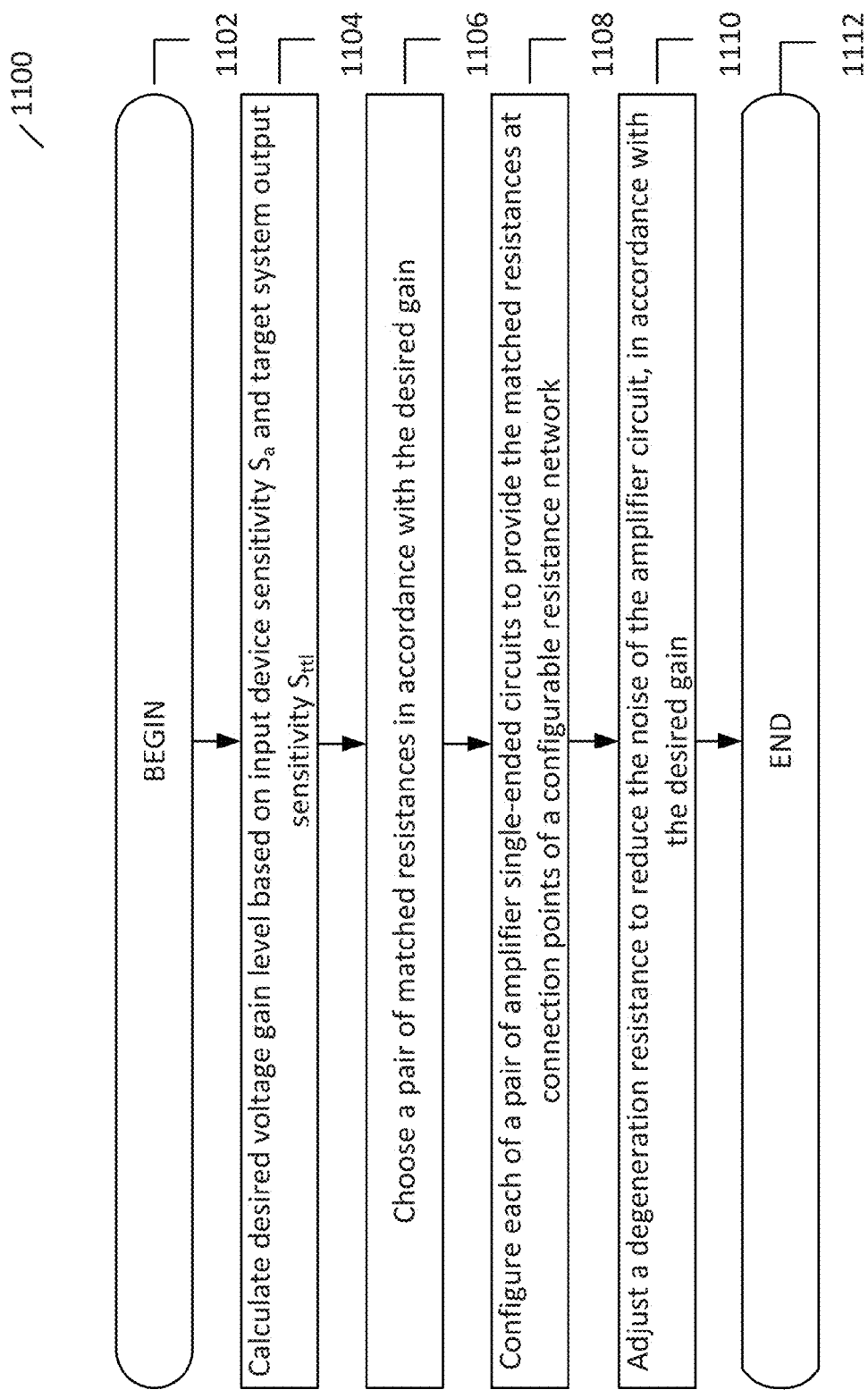
FIG. 11 is a flow diagram illustrating a method for configuring the voltage gain of an amplifier, in accordance with one of a number of embodiments.

FIG. 11 illustrates an embodiment method 1100 for configuring the voltage gain of an amplifier circuit. The method begins at step 1102. At step 1104, a desired voltage gain level for an amplifier circuit is calculated based on an input device sensitivity $S_a$ and a target system output sensitivity $S_{tl}$. At step 1106, a pair of matched resistances are chosen in accordance with the desired voltage gain. At step 1108, each of a pair of amplifier single-ended circuits is configured to provide the matched resistances at connection points of a configurable resistance network included in the single-ended circuit. In an embodiment, the configurable resistance network is connected to an output of an inverting amplifier stage, to the body of an input transistor, and to the source of the input transistor. At step 1110, a degeneration resistance is adjusted to reduce the noise of the amplifier circuit in accordance with the desired voltage gain. The method ends at step 1112.

Figure 12:
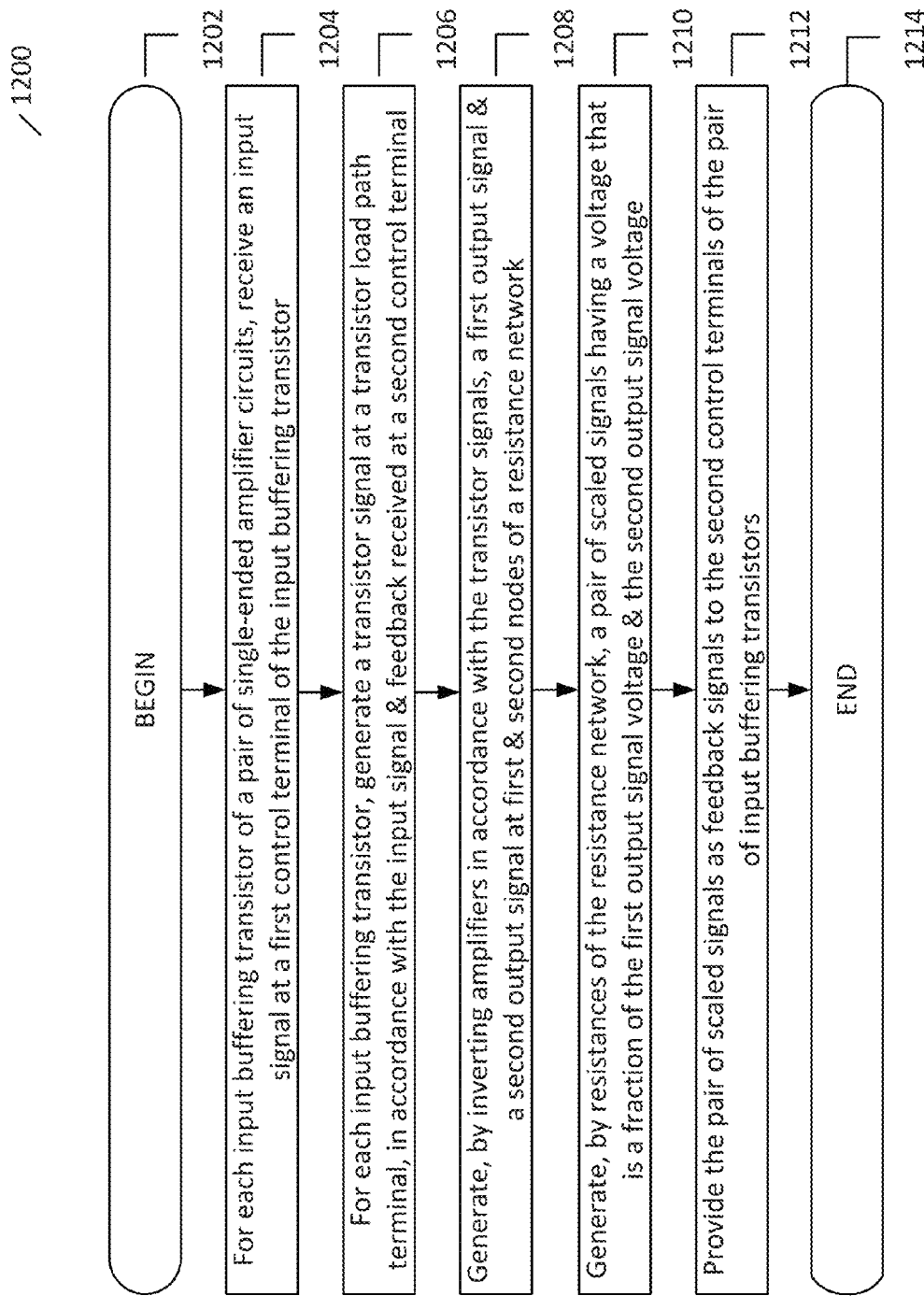
FIG. 12 is a flow diagram illustrating a method for signal amplification, in accordance with one of a number of embodiments.

FIG. 12 illustrates an embodiment method 1200 for signal amplification. The method begins at step 1202. At step 1204, for each input transistor of a pair of single-ended amplifier circuits, an input signal is received at a first control terminal of the input transistor. At step 1206, for each input transistor, a transistor signal is generated at a transistor load path terminal, in accordance with the input signal and feedback received at a second control terminal of the input transistor. At step 1208, inverting amplifiers included in each single-ended circuit generate, in accordance with the transistor signals that were generated at step 1206, a first output signal and a second output signal. These output signals are respectively generated at first and second nodes of a resistance network. At step 1210, resistances of the resistance network generate a pair of scaled signals having a voltage that is a respective fraction of the first output signal voltage and the second output signal voltage. At step 1212, each of the pair of scaled signals is respectively provided as a feedback signal to the second control terminal of each of the pair of input transistors. The method ends at step 1214.

Illustrative embodiments of the present invention have the advantage of providing not only positive-dB voltage gain but also attenuation. In some embodiments, a MEMS microphone with a differential output may be maintained in a constant-charge configuration to improve microphone sensitivity. In some embodiments, a pseudo-differential amplifier connected to a sensor circuit minimizes the number of input devices used while keeping the transfer function of the noise of the input device equal to the transfer function of the input signal. In some embodiments, an amplifier with differential inputs exhibits low power consumption, rail-to-rail output signal swing, low distortion, and low noise, is suitable for operating with low voltage supplies, and provides high impedance inputs and a programmable resistance network to support both positive-dB and negative-dB voltage gain.

The following additional example embodiments of the present invention are also provided. In accordance with a first example embodiment of the present invention, an amplification device is provided. The amplification device includes a resistance network coupled between a first output of the amplification device and a second output of the amplification device. The amplification device also includes a first transistor having a control terminal coupled to a first input node of the amplification device. The amplification device also includes a first load path terminal coupled to the resistance network at a first node. The amplification device also includes a second transistor having a control terminal coupled to a second input node of the amplification device and a first load path terminal coupled to the resistance network at a second node. The amplification device also includes a capacitive sensor coupled to the first input node and to the second input node. The amplification device also includes a first inverting amplifier that includes an input coupled to a second load path terminal of the first transistor and an output coupled to a first output node of the amplification device. The amplification device also includes a second inverting amplifier that includes an input coupled to a second load path terminal of the second transistor. The second inverting amplifier also includes an output coupled to a second output node of the amplification device.

Also, the foregoing first example embodiment may be implemented to include one or more of the following additional features. The amplification device may also be implemented to further include at least one of a first current source or a first degeneration resistor, which is coupled to the second load path terminal of the first transistor and to a first reference voltage. In this implementation, the amplification device also includes at least one of a second current source or a second degeneration resistor, which is coupled to the second load path terminal of the second transistor and to the first reference voltage.

The amplification device may also be implemented such that the first inverting amplifier includes a third current source and a third transistor. In this implementation, the third transistor has a first load path terminal coupled to the second load path terminal of the first transistor. The third transistor also includes a second load path terminal coupled to the third current source. The first inverting amplifier also includes a fourth transistor having a first load path terminal coupled to the first output node. The fourth transistor also has a control terminal coupled to the second load path terminal of the third transistor. The second inverting amplifier includes a fourth current source and a fifth transistor. The fifth transistor has a first load path terminal coupled to the second load path terminal of the second transistor. The fifth transistor also has a second load path terminal coupled to the fourth current source. The second inverting amplifier also includes a sixth transistor having a first load path terminal coupled to the second output node. The sixth transistor also includes a control terminal coupled to the second load path terminal of the fifth transistor.

The amplification device may also be implemented such that each of the first transistor, the second transistor, the fourth transistor, the sixth transistor, the third current source, and the fourth current source includes a metal oxide semiconductor field effect transistor (MOSFET) having a first channel type. In this implementation, each of the third transistor, the fifth transistor, the first current source, and the second current source includes a MOSFET having a second channel type. Each of the first channel type and the second channel type are opposite channel types selected from either a p-channel type or an n-channel type.

The amplification device may also be implemented such that it further includes a first bias resistor coupled between the first input node and a reference voltage. In this implementation, the amplification device also includes a second bias resistor coupled between the second input node an a second reference voltage.

The amplification device may also be implemented such that the first load path terminal of the first transistor is coupled to the first output node of the amplification device. In this implementation, the first load path terminal of the second transistor is coupled to the second output node of the amplification device.

The amplification device may also be implemented such that a second control terminal of the first transistor is coupled to one of a second reference voltage or a third node of the resistance network. In this implementation, a second control terminal of the second transistor is coupled to one of the second reference voltage or a fourth node of the resistance network.

The amplification device may also be implemented such that the resistance network further includes a first resistance coupled between a second control terminal of the first transistor and a third node of the resistance network. In this implementation, the resistance network also includes a second resistance coupled between the second control terminal of the first transistor and the output of the first inverting amplifier. The resistance network also includes a third resistance coupled between a second control terminal of the second transistor and the third node of the resistance network. The resistance network also includes a fourth resistance coupled between the second control terminal of the second transistor and the output of the second inverting amplifier. In this implementation, a voltage gain of the amplification device is in accordance with a ratio of the second resistance divided by the first resistance. A ratio of the fourth resistance divided by the third resistance is the same as the ratio of the second resistance divided by the first resistance.

The amplification device may also be implemented such that the first load path terminal of the first transistor is directly connected to the output of the first inverting amplifier. In this implementation, the first load path terminal of the second transistor is directly connected to the output of the second inverting amplifier.

The amplification device may also be implemented such that it further includes a first switch network coupled to the resistance network. In this implementation, the amplification device also includes a second switch network coupled to the resistance network. The first resistance and the second resistance are each selectable by configuring the first switch network in accordance with a voltage gain setting. The third resistance and the fourth resistance are each selectable by configuring the second switch network in accordance with the voltage gain setting.

The amplification device may also be implemented such that the first load path terminal of the first transistor is coupled to the second control terminal of the first transistor. In this implementation, the first load path terminal of the second transistor is coupled to the second control terminal of the second transistor. The second control terminal of the first transistor is a body terminal, and the second control terminal of the second transistor is a body terminal.

In accordance with a second example embodiment of the present invention, a method for signal amplification is provided. The method includes receiving, by a first control terminal of a first transistor, a first input signal from a capacitive sensor. The method also includes receiving, by a first control terminal of a second transistor, a second input signal from the capacitive sensor. The method also includes producing a first output signal, to include amplifying a first signal at a first load path terminal of the first transistor using a first inverting amplifier having an output coupled to a resistance network. The method also includes producing a second output signal, to include amplifying a second signal at a first load path terminal of the second transistor using a second inverting amplifier having an output coupled to the resistance network. The method also includes feeding back the first output signal and the second output signal to a second load path terminal of the first transistor and to a second load path terminal of the second transistor via the resistance network according to a pre-determined fraction.

Also, the foregoing second example embodiment may be implemented to include one or more of the following additional features. The method may also be implemented to further include adjusting the pre-determined fraction. In this implementation, adjusting the pre-determined fraction includes changing how the second load path terminal of the first transistor and the second load path terminal of the second transistor are coupled to the resistance network.

The method may also be implemented to further include feeding back the first output signal and the second output signal to a second control terminal of the first transistor and to a second control terminal of the second transistor via the resistance network according to the pre-determined fraction. In this implementation, a voltage difference between the first output signal and the second output signal is in accordance with a voltage difference between the first input signal and the second input signal and with a reciprocal of the pre-determined fraction.

The method may also be implemented to further include feeding back the first output signal and the second output signal to a second control terminal of the first transistor and to a second control terminal of the second transistor via the resistance network according to a second pre-determined fraction. In this implementation, the method also includes adjusting the second pre-determined fraction, which includes changing how the second control terminal of the first transistor and the second control terminal of the second transistor are coupled to the resistance network.

The method may also be implemented such that producing the first output signal further includes receiving, at a load path terminal of a third transistor included in the first inverting amplifier, the first signal from the first load path terminal of the first transistor. In this implementation, producing the second output signal further includes receiving, at a load path terminal of a fourth transistor included in the second inverting amplifier, the second signal from the first load path terminal of the second transistor. The resistance network includes a plurality of series connected resistors coupled between the output of the first inverting amplifier at a first node and the output of the second inverting amplifier at a second node. A second control terminal of the first transistor is selectably coupled to a third node of the resistance network between the first node and the second node, and a second control terminal of the second transistor is selectably coupled to a fourth node of the resistance network between the third node and the second node.

The method may also be implemented such that each of the first transistor and the second transistor includes a MOSFET. In this implementation, the second control terminal of the first transistor is a body terminal, and the second control terminal of the second transistor is a body terminal. The method may also be implemented such that the predetermined fraction is 1.

In accordance with a third example embodiment of the present invention, an amplifier system is provided. The amplifier system includes a first transistor having a control terminal coupled to a first input node, a second transistor having a control terminal coupled to a second input node. In this implementation, the amplifier system also includes a first inverting amplifier. The first inverting amplifier includes a third transistor having a first load path terminal coupled to the first load path terminal of the first transistor. The amplifier system also includes a first output node coupled to an output of the first inverting amplifier. The amplifier system also includes a second inverting amplifier, which includes a fourth transistor having a first load path terminal coupled to the first load path terminal of the second transistor. The amplifier system also includes a second output node coupled to an output of the second inverting amplifier. The amplifier system also includes a switchable resistance network coupled between the output of the first inverting amplifier and the output of the second inverting amplifier. The switchable resistance network is selectably coupled to a second load path terminal of the first transistor and to a second load path terminal of the second transistor.

Also, the foregoing first example embodiment may be implemented to include one or more of the following additional features. The amplifier system may also be implemented to further include a capacitive sensor coupled to the first input node and to the second input node. In this implementation, the capacitive sensor includes a dual back-plate micro-electro-mechanical system (MEMS) device that is capacitively coupled to the first input node and to the second input node. The amplifier system may also be implemented such that the dual back-plate MEMS device is a microphone.

The amplifier system may also be implemented to further include a first current source coupled to the first load path terminal of the first transistor, and a second current source coupled to the first load path terminal of the second transistor. In this implementation, the first inverting amplifier includes a third current source coupled to a second load path terminal of the third transistor. The first inverting amplifier also includes a fifth transistor. The fifth transistor has a first load path terminal coupled to the first output node, and also has a control terminal coupled to the second load path terminal of the third transistor. The second inverting amplifier includes a fourth current source coupled to a second load path terminal of the fourth transistor. The second inverting amplifier also includes a sixth transistor having a first load path terminal coupled to the second output node. The sixth transistor also has a control terminal coupled to the second load path terminal of the fourth transistor.

The amplifier system may also be implemented to further include a fifth current source coupled to a third node of the switchable resistance network. In this implementation, the amplifier system also includes a first bias resistor and a second bias resistor. The first bias resistor is coupled between a reference voltage and the control terminal of the first transistor, and the second bias resistor is coupled between the reference voltage and the control terminal of the second transistor.

The amplifier system may also be implemented such that the second load path terminal of the first transistor is directly connected to the second output node. In this implementation, the second load path terminal of the second transistor is directly connected to the second output node.

The amplifier system may also be implemented such that a second control terminal of the first transistor is coupled to a fourth node of the switchable resistance network. In this implementation, a second control terminal of the second transistor is coupled to a fifth node of the switchable resistance network.

The amplifier system may also be implemented such that the switchable resistance network further includes a first resistance coupled between a second control terminal of the first transistor and a third node of the switchable resistance network. In this implementation, the switchable resistance network also includes a second resistance coupled between the second control terminal of the first transistor and the output of the first inverting amplifier. The switchable resistance network also includes a third resistance coupled between a second control terminal of the second transistor and the third node of the switchable resistance network. The switchable resistance network also includes a fourth resistance coupled between the second control terminal of the second transistor and the output of the second inverting amplifier.

The amplifier system may also be implemented to further include a voltage gain, where the second load path terminal of the first transistor is coupled to the second control terminal of the first transistor, and the second load path terminal of the second transistor is coupled to the second control terminal of the second transistor. In this implementation, the voltage gain is in accordance with a ratio of the second resistance divided by the first resistance. A ratio of the fourth resistance divided by the third resistance is the same as the ratio of the second resistance divided by the first resistance.

The amplifier system may also be implemented to further include a first switch network coupled to the switchable resistance network, and a second switch network coupled to the switchable resistance network. In this implementation, the first resistance and the second resistance are each selectable by configuring the first switch network in accordance with a voltage gain setting. The third resistance and the fourth resistance are each selectable by configuring the second switch network in accordance with the voltage gain setting.

The amplifier system may also be implemented such that each of the first transistor, the second transistor, the fifth transistor, the sixth transistor, the third current source, and the fourth current source includes a MOSFET having a first channel type. In this implementation, each of the third transistor, the fourth transistor, the first current source, and the second current source includes a MOSFET having a second channel type, and each of the first channel type and the second channel type include opposite channel types selected from either a p-channel type or an n-channel type. The second control terminal of the first transistor is a body terminal, and the second control terminal of the second transistor is a body terminal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications or embodiments.

What is claimed is:

1. An amplification device, comprising:
   a resistance network coupled between a first output of the amplification device and a second output of the amplification device,
   a first transistor having a control terminal coupled to a first input node of the amplification device and a first load path terminal coupled to the resistance network at a first node;
   a second transistor having a control terminal coupled to a second input node of the amplification device and a first load path terminal coupled to the resistance network at a second node, wherein at least one of the first input node and the second input node is configured to be coupled to a capacitive sensor;
   a first inverting amplifier comprising an input coupled to a second load path terminal of the first transistor and an output coupled to a first output node of the amplification device, wherein the first inverting amplifier comprises
      a third current source,
      a third transistor having a first load path terminal coupled to the second load path terminal of the first transistor,
      a second load path terminal coupled to the third current source, and
      a fourth transistor having a first load path terminal coupled to the first output node, and a control terminal coupled to the second load path terminal of the third transistor; and
   a second inverting amplifier comprising an input coupled to a second load path terminal of the second transistor and an output coupled to a second output node of the amplification device, wherein the second inverting amplifier comprises
      a fourth current source,
      a fifth transistor having a first load path terminal coupled to the second load path terminal of the second transistor, and a second load path terminal coupled to the fourth current source, and
      a sixth transistor having a first load path terminal coupled to the second output node, and a control terminal coupled to the second load path terminal of the fifth transistor.

2. The amplification device of claim 1, further comprising:
   at least one of a first current source or a first degeneration resistor, coupled to the second load path terminal of the first transistor and to a first reference voltage; and
   at least one of a second current source or a second degeneration resistor, coupled to the second load path terminal of the second transistor and to the first reference voltage.

3. The amplification device of claim 2, wherein:
   each of the first transistor, the second transistor, the fourth transistor, the sixth transistor, the third current source, and the fourth current source comprises a metal oxide semiconductor field effect transistor (MOSFET) having a first channel type,
   each of the third transistor, the fifth transistor, the first current source, and the second current source comprises a MOSFET having a second channel type; and
   each of the first channel type and the second channel type comprise opposite channel types selected from a p-channel type or an n-channel type.

4. The amplification device of claim 2, further comprising:
   a first bias resistor coupled between the first input node and a reference voltage; and
   a second bias resistor coupled between the second input node and a second reference voltage.

5. The amplification device of claim 2, wherein:
   the first load path terminal of the first transistor is coupled to the first output node of the amplification device; and
   the first load path terminal of the second transistor is coupled to the second output node of the amplification device.

6. The amplification device of claim 2, wherein:
   a second control terminal of the first transistor is coupled to one of a second reference voltage or a third node of the resistance network; and
   a second control terminal of the second transistor is coupled to one of the second reference voltage or a fourth node of the resistance network.

7. An amplification device, comprising:
   a resistance network coupled between a first output of the amplification device and a second output of the amplification device,
   a first transistor having a control terminal coupled to a first input node of the amplification device and a first load path terminal coupled to the resistance network at a first node;
   a second transistor having a control terminal coupled to a second input node of the amplification device and a first load path terminal coupled to the resistance network at a second node, wherein at least one of the first input node and the second input node is configured to be coupled to a capacitive sensor;
   a first inverting amplifier comprising an input coupled to a second load path terminal of the first transistor and an output coupled to a first output node of the amplification device; and
   a second inverting amplifier comprising an input coupled to a second load path terminal of the second transistor and an output coupled to a second output node of the amplification device;
   a first resistance coupled between a second control terminal of the first transistor and a third node of the resistance network;
   a second resistance coupled between the second control terminal of the first transistor and the output of the first inverting amplifier;
   a third resistance coupled between a second control terminal of the second transistor and the third node of the resistance network; and
   a fourth resistance coupled between the second control terminal of the second transistor and the output of the second inverting amplifier; and wherein:
      a voltage gain of the amplification device is in accordance with a ratio of the second resistance divided by the first resistance, and
      a ratio of the fourth resistance divided by the third resistance is the same as the ratio of the second resistance divided by the first resistance.

8. The amplification device of claim 7, wherein:
   the first load path terminal of the first transistor is directly connected to the output of the first inverting amplifier; and
   the first load path terminal of the second transistor is directly connected to the output of the second inverting amplifier.

9. The amplification device of claim 7, further comprising:
a first switch network coupled to the resistance network; and
a second switch network coupled to the resistance network, wherein
the first resistance and the second resistance are each selectable by configuring the first switch network in accordance with a voltage gain setting, and
the third resistance and the fourth resistance are each selectable by configuring the second switch network in accordance with the voltage gain setting.

10. The amplification device of claim 7, wherein:
the first load path terminal of the first transistor is coupled to the second control terminal of the first transistor;
the first load path terminal of the second transistor is coupled to the second control terminal of the second transistor;
the second control terminal of the first transistor is a body terminal; and
the second control terminal of the second transistor is a body terminal.

11. A method for signal amplification, comprising:
receiving, by a first control terminal of a first transistor, a first input signal from a capacitive sensor;
receiving, by a first control terminal of a second transistor, a second input signal from the capacitive sensor;
producing a first output signal, producing the first output signal comprising amplifying a first signal at a first load path terminal of the first transistor using a first inverting amplifier having an output coupled to a resistance network, and receiving, at a load path terminal of a third transistor comprised in the first inverting amplifier, the first signal from the first load path terminal of the first transistor;
producing a second output signal, producing the second output signal comprising amplifying a second signal at a first load path terminal of the second transistor using a second inverting amplifier having an output coupled to the resistance network, the producing the second output signal further comprises receiving, at a load path terminal of a fourth transistor comprised in the second inverting amplifier, the second signal from the first load path terminal of the second transistor; and
feeding back the first output signal and the second output signal to a second load path terminal of the first transistor and to a second load path terminal of the second transistor via the resistance network according to a pre-determined fraction, wherein
the resistance network comprises a plurality of series connected resistors coupled between the output of the first inverting amplifier at a first node and the output of the second inverting amplifier at a second node,
a second control terminal of the first transistor is selectably coupled to a third node of the resistance network between the first node and the second node, and
a second control terminal of the second transistor is selectably coupled to a fourth node of the resistance network between the third node and the second node.

12. The method of claim 11, further comprising:
adjusting the pre-determined fraction, adjusting the pre-determined fraction comprising changing how the second load path terminal of the first transistor and the second load path terminal of the second transistor are coupled to the resistance network.

13. The method of claim 11, further comprising:
feeding back the first output signal and the second output signal to a second control terminal of the first transistor and to a second control terminal of the second transistor via the resistance network according to the pre-determined fraction, wherein
a voltage difference between the first output signal and the second output signal is in accordance with a voltage difference between the first input signal and the second input signal and with a reciprocal of the pre-determined fraction.

14. The method of claim 11, further comprising:
feeding back the first output signal and the second output signal to a second control terminal of the first transistor and to a second control terminal of the second transistor via the resistance network according to a second pre-determined fraction; and
adjusting the second pre-determined fraction, adjusting the second pre-determined fraction comprising changing how the second control terminal of the first transistor and the second control terminal of the second transistor are coupled to the resistance network.

15. The method of claim 11, wherein:
each of the first transistor and the second transistor comprises a metal oxide semiconductor field effect transistor (MOSFET);
the second control terminal of the first transistor is a body terminal; and
the second control terminal of the second transistor is a body terminal.

16. The method of claim 11, wherein:
the pre-determined fraction is 1.

17. An amplifier system, comprising:
a first transistor having a control terminal coupled to a first input node;
a second transistor having a control terminal coupled to a second input node;
a first inverting amplifier comprising a third transistor having a first load path terminal coupled to the first load path terminal of the first transistor;
a first output node coupled to an output of the first inverting amplifier;
a second inverting amplifier comprising a fourth transistor having a first load path terminal coupled to the first load path terminal of the second transistor;
a second output node coupled to an output of the second inverting amplifier; and
a switchable resistance network coupled between the output of the first inverting amplifier and the output of the second inverting amplifier, wherein the switchable resistance network is selectably coupled to a second load path terminal of the first transistor and to a second load path terminal of the second transistor.

18. The amplifier system of claim 17, further comprising:
a capacitive sensor coupled to the first input node and to the second input node, wherein
the capacitive sensor comprises a dual back-plate micro-electro-mechanical system (MEMS) device that is capacitively coupled to the first input node and to the second input node.

19. The amplifier system of claim 18, wherein the dual back-plate MEMS device comprises a microphone.

20. The amplifier system of claim 17, further comprising:
a first current source coupled to the first load path terminal of the first transistor; and
a second current source coupled to the first load path terminal of the second transistor, wherein:

the first inverting amplifier comprises:
   a third current source coupled to a second load path terminal of the third transistor; and
   a fifth transistor having a first load path terminal coupled to the first output node, and a control terminal coupled to the second load path terminal of the third transistor; and
the second inverting amplifier comprises:
   a fourth current source coupled to a second load path terminal of the fourth transistor; and
   a sixth transistor having a first load path terminal coupled to the second output node, and a control terminal coupled to the second load path terminal of the fourth transistor.

21. The amplifier system of claim 20, further comprising:
a fifth current source coupled to a third node of the switchable resistance network,
a first bias resistor coupled between a reference voltage and the control terminal of the first transistor; and
a second bias resistor coupled between the reference voltage and the control terminal of the second transistor.

22. The amplifier system of claim 20, wherein:
the second load path terminal of the first transistor is directly connected to the second output node; and
the second load path terminal of the second transistor is directly connected to the second output node.

23. The amplifier system of claim 22, wherein:
a second control terminal of the first transistor is coupled to a fourth node of the switchable resistance network; and
a second control terminal of the second transistor is coupled to a fifth node of the switchable resistance network.

24. The amplifier system of claim 20, wherein the switchable resistance network further comprises:
   a first resistance coupled between a second control terminal of the first transistor and a third node of the switchable resistance network;
   a second resistance coupled between the second control terminal of the first transistor and the output of the first inverting amplifier;
   a third resistance coupled between a second control terminal of the second transistor and the third node of the switchable resistance network; and
   a fourth resistance coupled between the second control terminal of the second transistor and the output of the second inverting amplifier.

25. The amplifier system of claim 24, further comprising a voltage gain, wherein:
   the second load path terminal of the first transistor is coupled to the second control terminal of the first transistor;
   the second load path terminal of the second transistor is coupled to the second control terminal of the second transistor;
   the voltage gain is in accordance with a ratio of the second resistance divided by the first resistance; and
   a ratio of the fourth resistance divided by the third resistance is the same as the ratio of the second resistance divided by the first resistance.

26. The amplifier system of claim 24, further comprising:
a first switch network coupled to the switchable resistance network; and
a second switch network coupled to the switchable resistance network, wherein
   the first resistance and the second resistance are each selectable by configuring the first switch network in accordance with a voltage gain setting, and
   the third resistance and the fourth resistance are each selectable by configuring the second switch network in accordance with the voltage gain setting.

27. The amplifier system of claim 26, wherein:
each of the first transistor, the second transistor, the fifth transistor, the sixth transistor, the third current source, and the fourth current source comprises a metal oxide semiconductor field effect transistor (MOSFET) having a first channel type;
each of the third transistor, the fourth transistor, the first current source, and the second current source comprises a MOSFET having a second channel type;
each of the first channel type and the second channel type comprise opposite channel types selected from a p-channel type or an n-channel type;
the second control terminal of the first transistor is a body terminal; and
the second control terminal of the second transistor is a body terminal.

28. The amplifier system of claim 17, wherein the switchable resistance network comprises:
   a first plurality of resistors coupled between the output of the first inverting amplifier and an intermediate node;
   a first plurality of switches coupled between the output of the first inverting amplifier and corresponding resistors of the first plurality of resistors;
   a second plurality of resistors coupled between the intermediate node and the output of the second inverting amplifier; and
   a second plurality of switches coupled between the output of the second inverting amplifier and corresponding resistors of the second plurality of resistors.

29. The amplifier system of claim 28, further comprising:
a third plurality of switches coupled between a bulk node of the first transistor and the corresponding resistors of the first plurality of resistors; and
a fourth plurality of switches coupled between a bulk node of the second transistor and corresponding resistors of the second plurality of resistors.

30. The amplification device of claim 1, further comprising the capacitive sensor.

31. The amplification device of claim 7, further comprising the capacitive sensor.

32. The amplification device of claim 7, further comprising:
   at least one of a first current source or a first degeneration resistor, coupled to the second load path terminal of the first transistor and to a first reference voltage; and
   at least one of a second current source or a second degeneration resistor, coupled to the second load path terminal of the second transistor and to the first reference voltage.

* * * * *